United States Patent
Conradi et al.

(10) Patent No.: US 9,069,263 B2
(45) Date of Patent: *Jun. 30, 2015

(54) METHOD FOR IMPROVING THE IMAGING PROPERTIES OF A PROJECTION OBJECTIVE, AND SUCH A PROJECTION OBJECTIVE

(75) Inventors: Olaf Conradi, Westhausen/Westerhofen (DE); Heiko Feldmann, Aalen (DE); Gerald Richter, Abtsgmuend (DE); Sascha Bleidistel, Aalen (DE); Andreas Frommeyer, Schwaebisch Gmuend (DE); Toralf Gruner, Aalen-Hofen (DE); Wolfgang Hummel, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 903 days.

This patent is subject to a terminal disclaimer.

(21) Appl. No.: 12/836,176

(22) Filed: Jul. 14, 2010

(65) Prior Publication Data

US 2010/0290024 A1 Nov. 18, 2010

Related U.S. Application Data

(63) Continuation of application No. 11/915,191, filed as application No. PCT/EP2006/004929 on May 24, 2006, now Pat. No. 7,777,963.

(60) Provisional application No. 60/685,716, filed on May 27, 2005.

(51) Int. Cl.
*G02B 9/00* (2006.01)
*G02B 17/00* (2006.01)
*G03F 7/20* (2006.01)

(52) U.S. Cl.
CPC ........ *G03F 7/70558* (2013.01); *G03F 7/70266* (2013.01); *Y10S 359/90* (2013.01)

(58) Field of Classification Search
CPC .................................................. G03F 7/70558
USPC ......... 359/649–651, 819–820, 726, 732, 900; 355/52, 55
See application file for complete search history.

(56) References Cited

U.S. PATENT DOCUMENTS 4,226,507 A 10/1980 Fuschetto
4,993,823 A 2/1991 Schaffer, Jr. et al.
(Continued)

FOREIGN PATENT DOCUMENTS

DE 102 10 899 9/2003
EP 1 014 139 A2 6/2000
(Continued)

OTHER PUBLICATIONS

International Search Report and Written Opinion dated Dec. 2, 2007, for PCT Application No. PCT/EP2006/004929, filed May 24, 2006.
(Continued)

*Primary Examiner* — Zachary Wilkes
(74) *Attorney, Agent, or Firm* — Fish & Richardson P.C.

(57) ABSTRACT

The invention relates to a method for improving the imaging properties of a micro lithography projection objective, wherein the projection objective has a plurality of lenses between an object plane and an image plane, a first lens of the plurality of lenses being assigned a first manipulator (ml, Mn) for actively deforming the lens, the first lens being deformed for at least partially correcting an aberration, at least one second lens of the plurality of lenses furthermore being assigned at least one second manipulator, and the second lens being deformed in addition to the first lens. Furthermore, a method is described for selecting at least one lens of a plurality of lenses of a projection objective as actively deformable element, and a projection objective.

28 Claims, 19 Drawing Sheets

(56) References Cited

U.S. PATENT DOCUMENTS

| | | | |
|---|---|---|---|
| 6,101,042 A | 8/2000 | Sato | |
| 6,388,823 B1 | 5/2002 | Gaber et al. | |
| 6,600,608 B1 | 7/2003 | Shafer et al. | |
| 6,646,718 B2 | 11/2003 | Schuster et al. | |
| 6,831,794 B2 | 12/2004 | Schuster et al. | |
| 7,088,426 B2* | 8/2006 | Hirukawa et al. | 355/55 |
| 7,436,484 B2* | 10/2008 | Van Der Wijst et al. | 355/52 |
| 2003/0002023 A1 | 1/2003 | Bunau et al. | |
| 2003/0063268 A1* | 4/2003 | Kneer et al. | 359/763 |
| 2003/0234918 A1 | 12/2003 | Watson | |
| 2004/0059444 A1 | 3/2004 | Tsukakoshi | |
| 2005/0046815 A1 | 3/2005 | Ebinuma et al. | |

FOREIGN PATENT DOCUMENTS

| | | |
|---|---|---|
| JP | 10-39208 | 2/1998 |
| JP | 11-295597 | 10/1999 |
| JP | 2001-166210 | 6/2001 |
| JP | 2002-519843 | 7/2002 |
| JP | 2004-317534 A | 11/2004 |
| WO | WO 99/67683 | 12/1999 |
| WO | WO 02/054036 | 7/2002 |
| WO | WO 2004/019128 A | 3/2004 |

OTHER PUBLICATIONS

International Preliminary Report on Patentability dated Nov. 29, 2007, for PCT Application No. PCT/EP2006/004929, filed May 24, 2006.

Japanese Office Action, with English translation, for corresponding JP Appl No. 2008-512758, dated Dec. 12, 2011.

Japanese Office Action, with English translation, for corresponding JP Appl. No. 2008-512758, dated Jan. 29, 2013.

Taiwanese Office Action, with English translation, for corresponding TW Appl No. 095118286, dated Sep. 26, 2013.

Japanese Office Action, with English translation, for corresponding JP Appl. No. 2008-512758, dated Sep. 25, 2013.

* cited by examiner

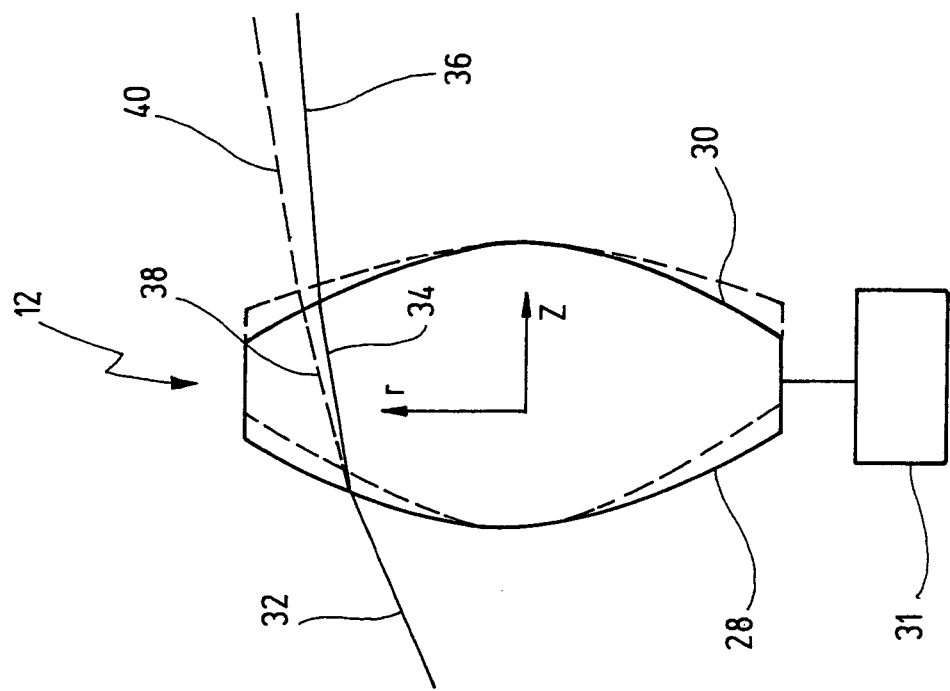
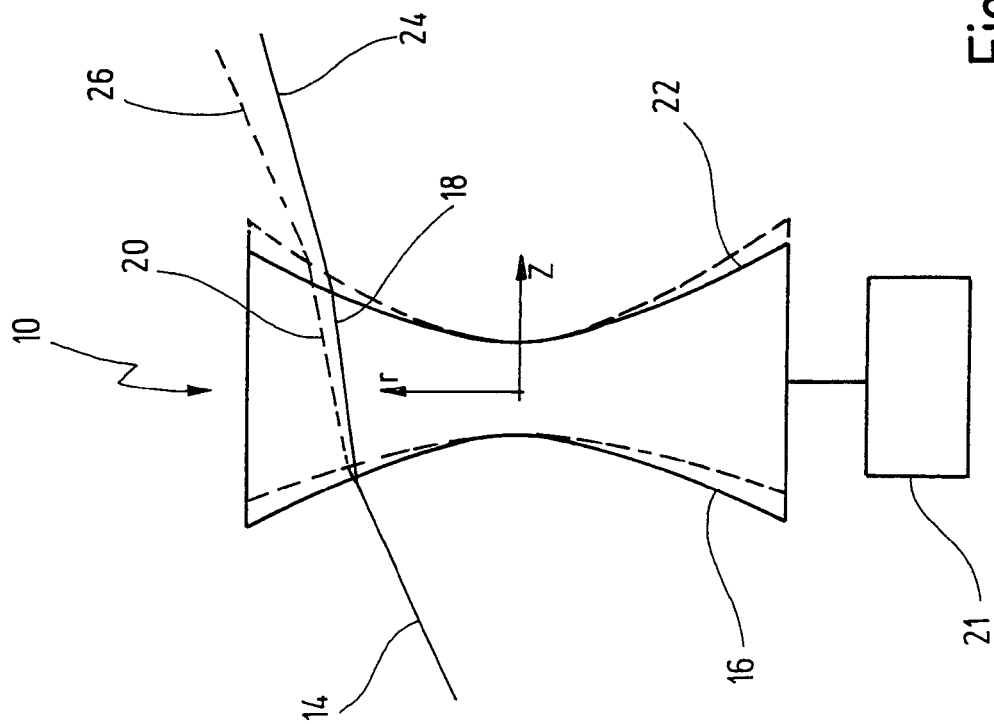
Fig.2

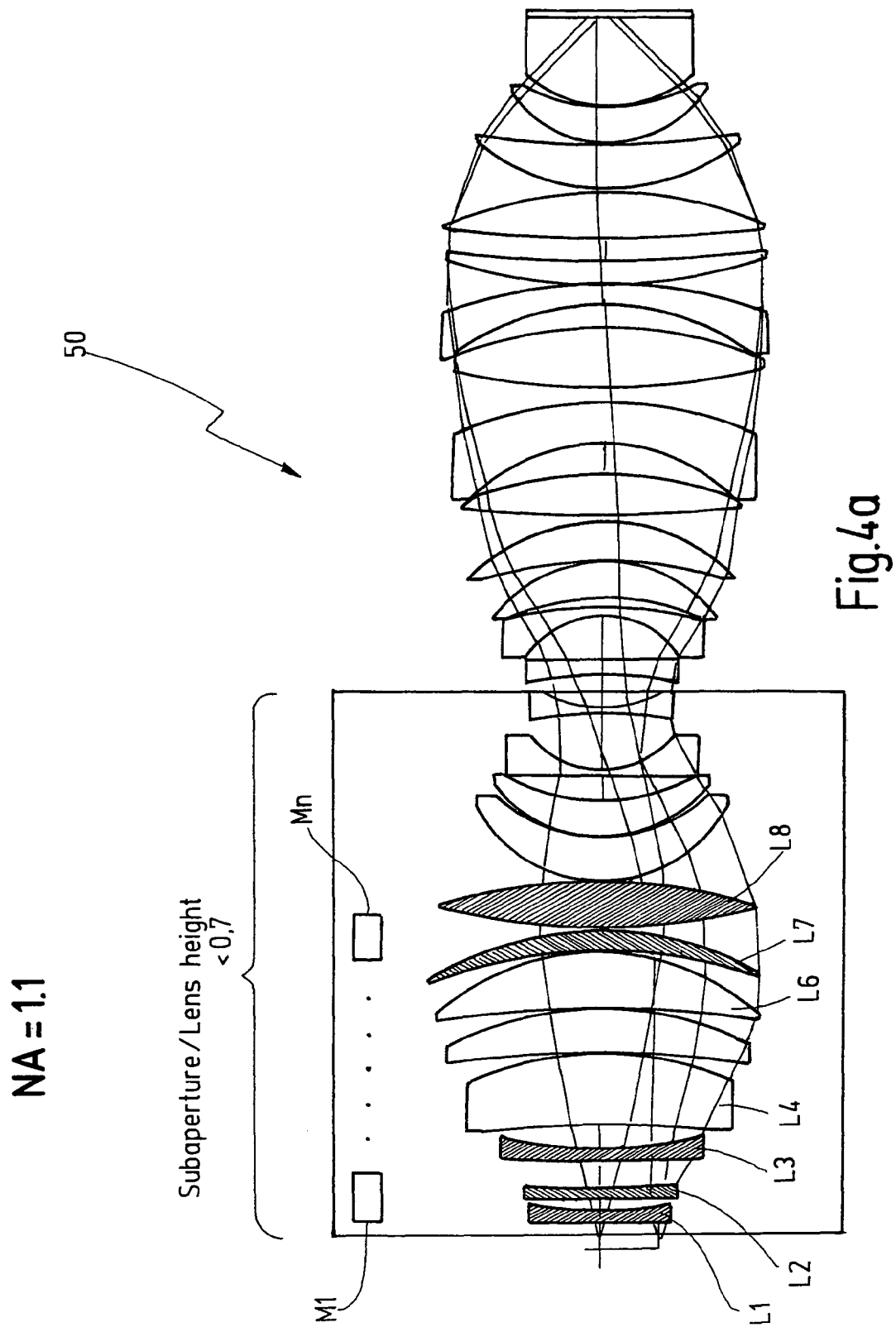

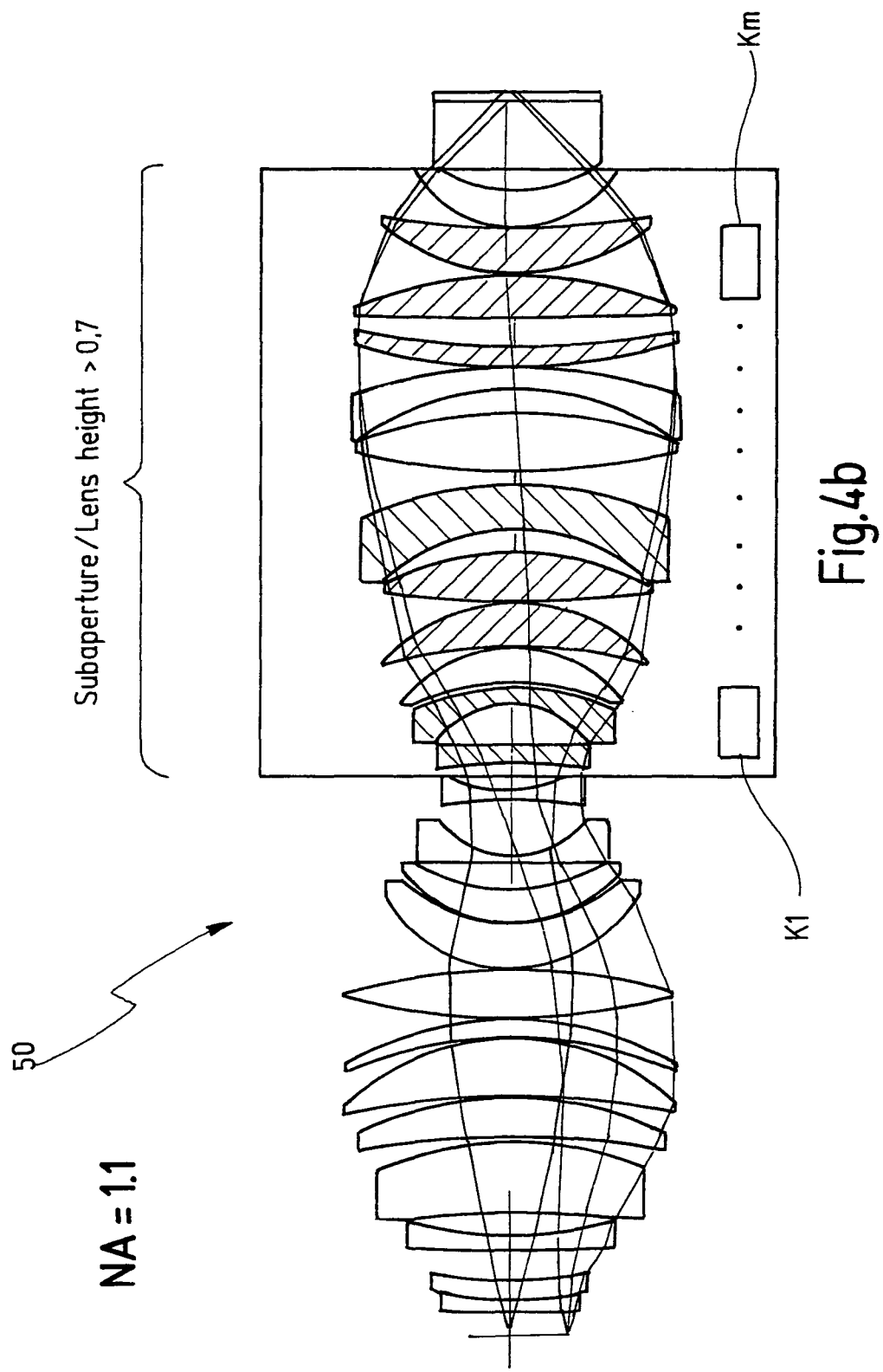

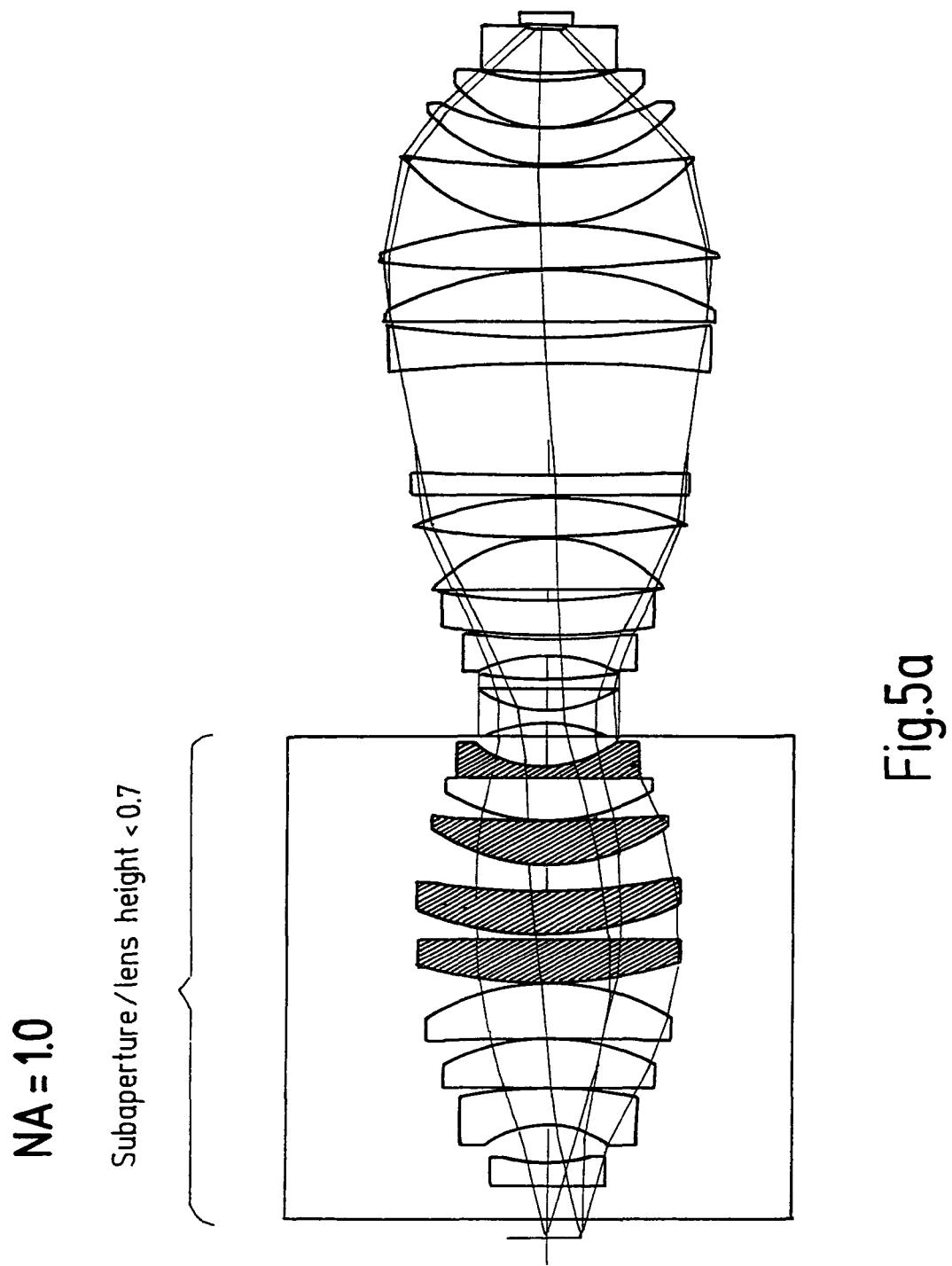

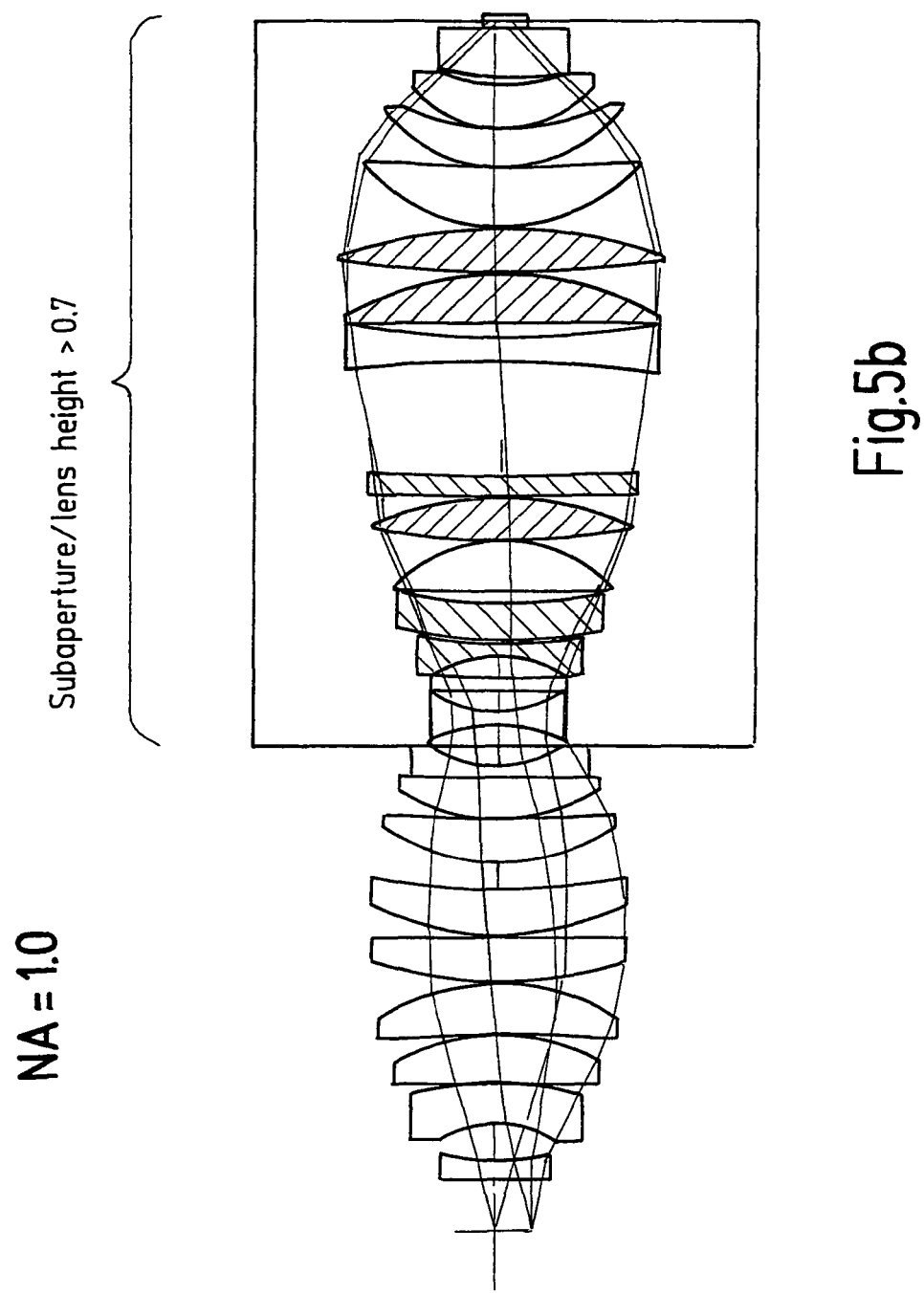

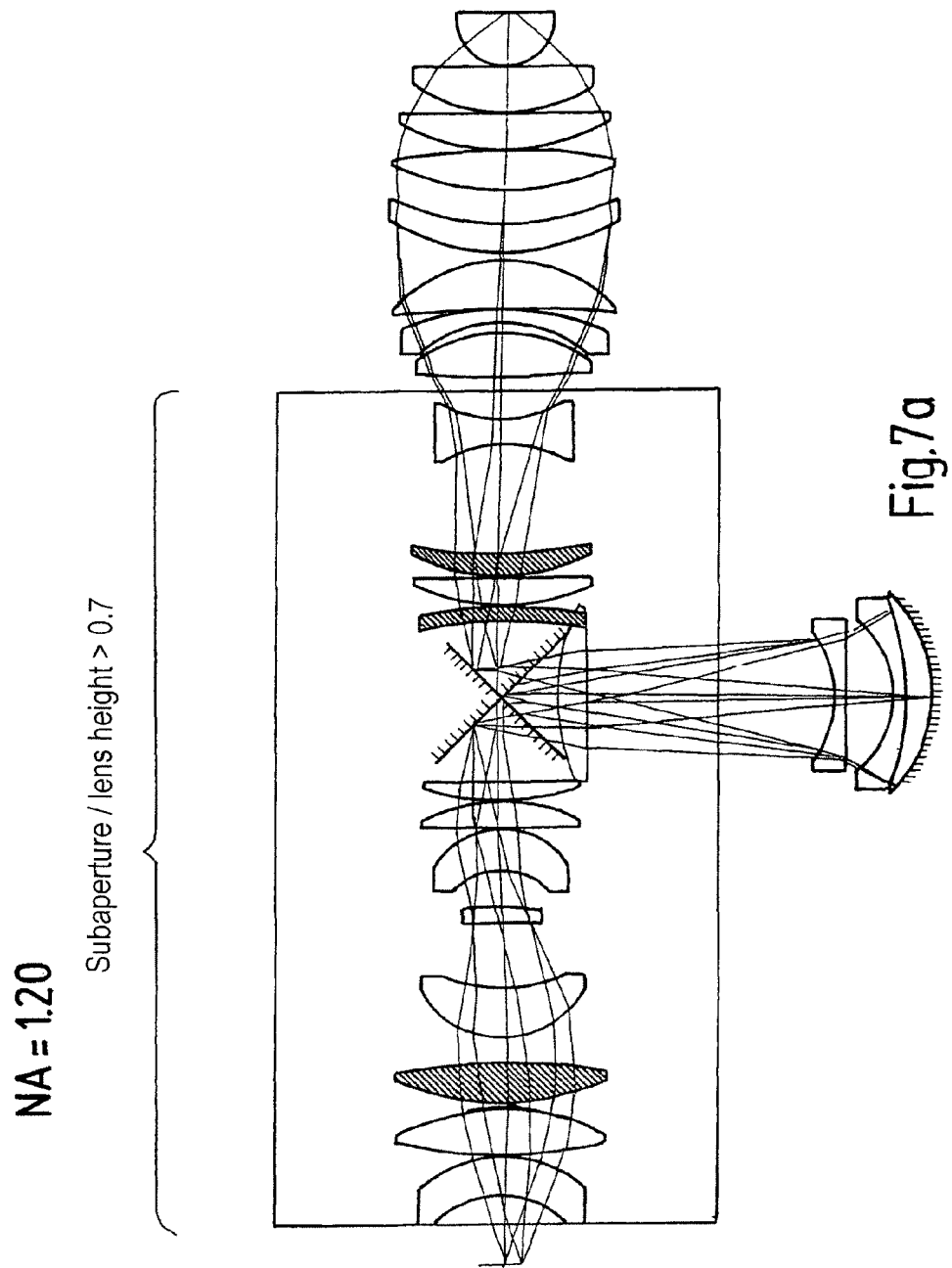

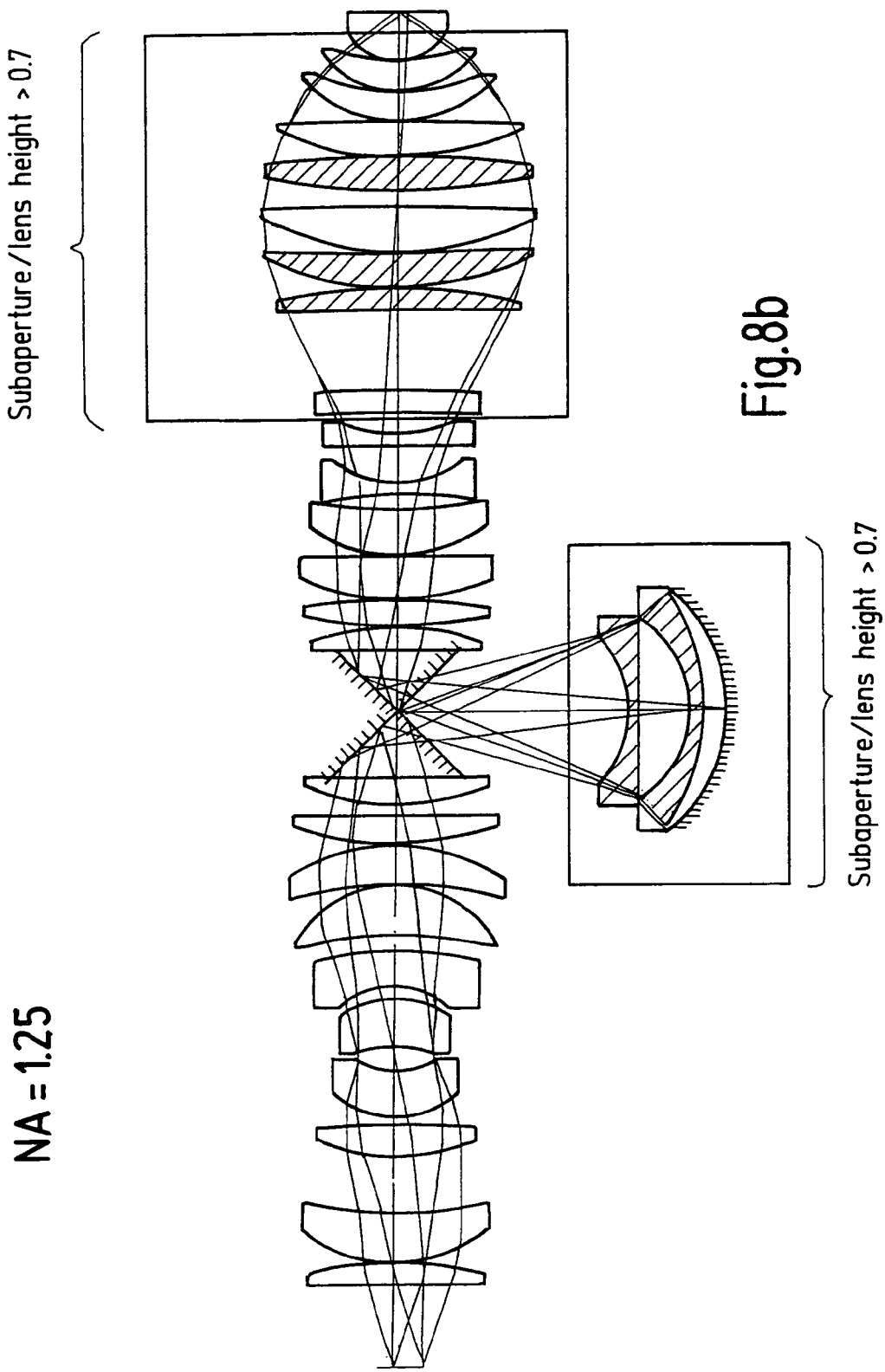

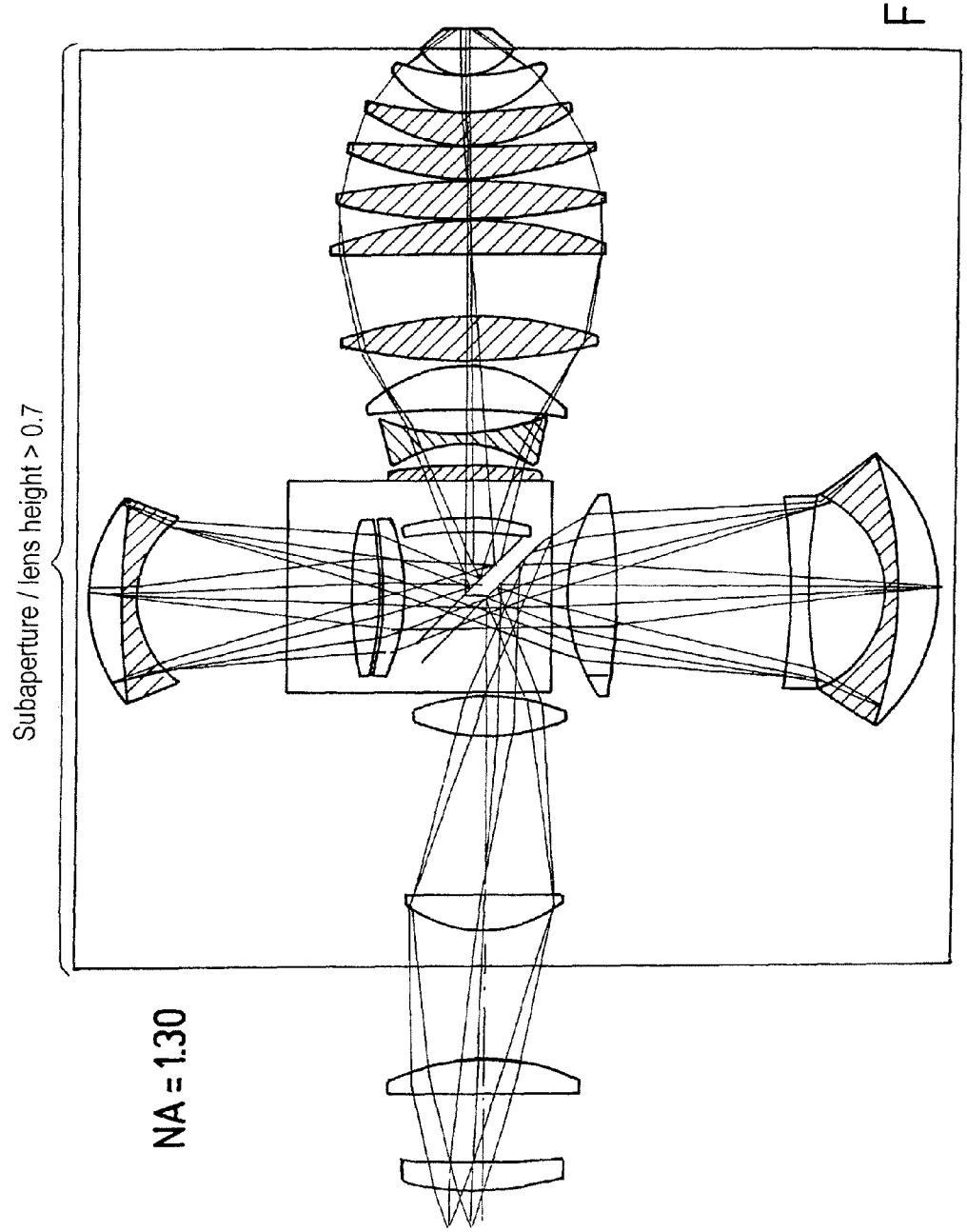

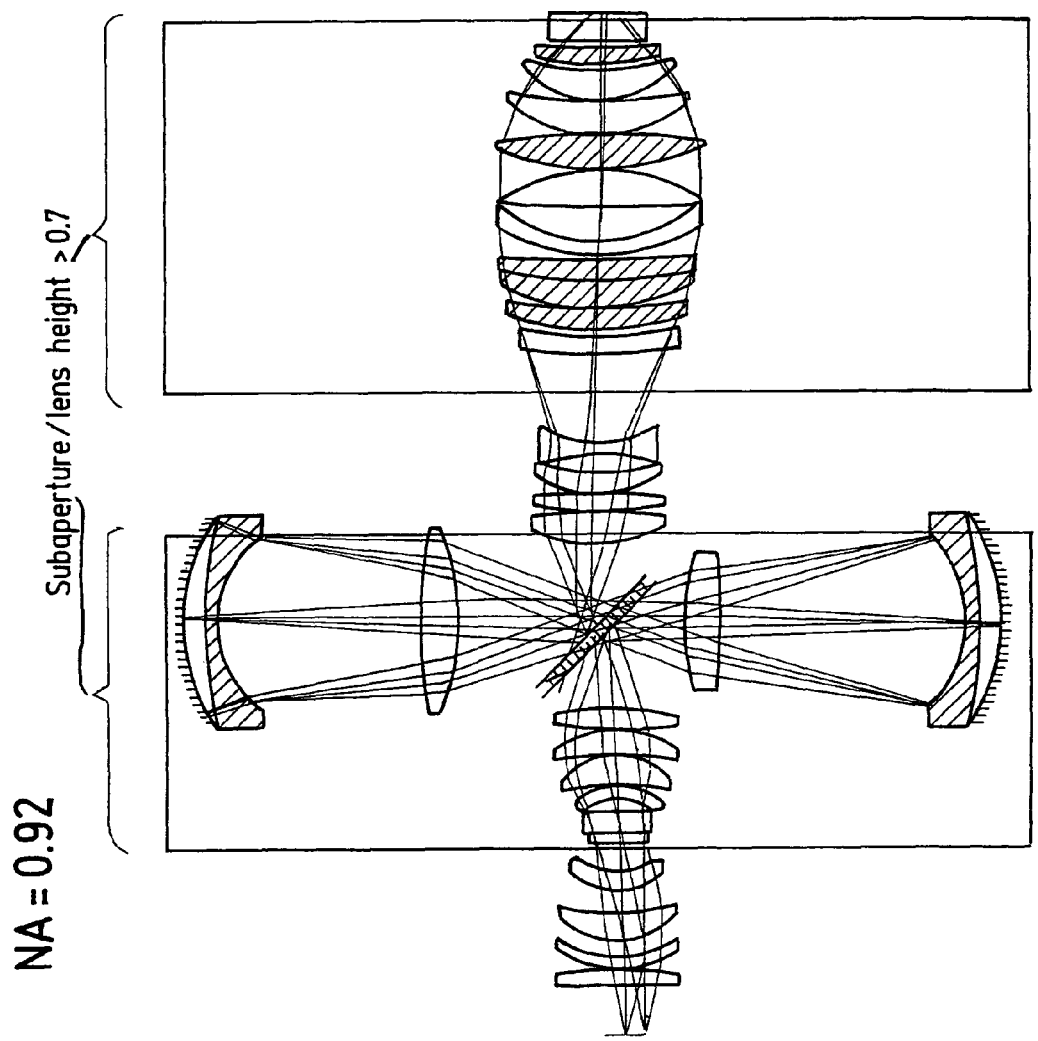

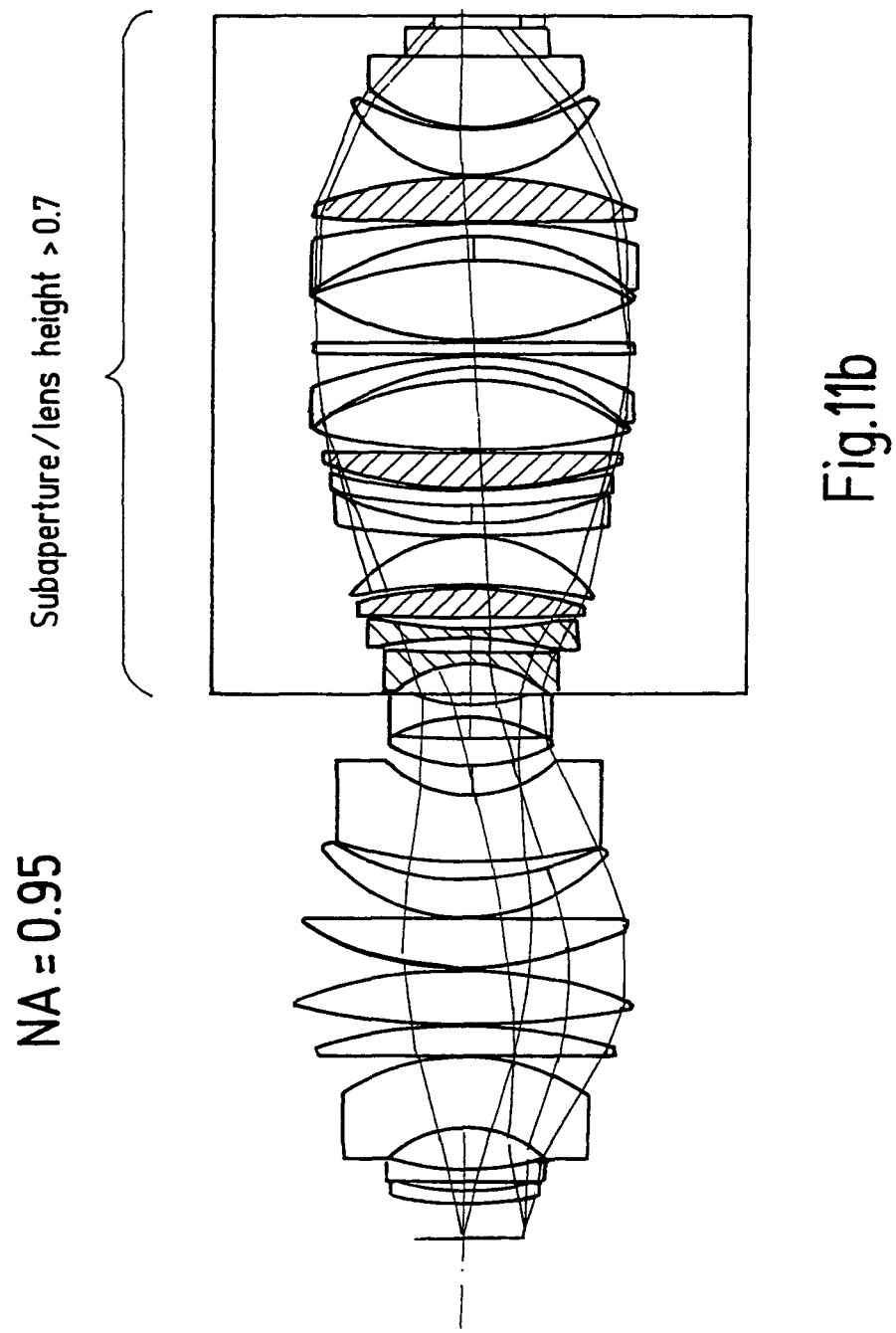

METHOD FOR IMPROVING THE IMAGING PROPERTIES OF A PROJECTION OBJECTIVE, AND SUCH A PROJECTION OBJECTIVE

CROSS-REFERENCE TO RELATED APPLICATIONS

This application is a continuation application of U.S. application Ser. No. 11/915,191, filed on May 12, 2008, which is a National Phase application under 35 U.S.C. §371 filed from International Patent Application Serial No. PCT/EP2006/004929, filed on May 24, 2006, which claims priority to U.S. Provisional Application Ser. No. 60/685,716, filed May 27, 2005.

The invention relates to a method for improving the imaging properties of a microlithography projection objective.

The invention further relates to a method for selecting at least one lens of a plurality of lenses of a microlithography projection objective as actively deformable element for at least partially correcting an image defect.

The invention further relates to a projection objective.

Projection objectives are used in lithographic methods in order to produce, for example, semiconductor components, image pick-up elements, displays and the like. In general, projection objectives are used for the lithographic production of finely structured components.

A projection objective is constructed from a plurality of optical elements that can all be lenses, or the projection objective can consist of a combination of lenses and mirrors.

The projection objective is used to image a structure or a pattern of a mask (reticle), that is arranged in the object plane of the projection objective, onto a photosensitive substrate that is arranged in the image plane of the projection objective. The structures or patterns to be imaged are becoming ever smaller in order to raise the integration density of the components to be produced, and so increasingly higher demands are being made of the resolution and of the imaging quality of present-day projection objectives.

The imaging quality of a projection objective can be worsened by aberrations.

Such aberrations can be of various types. Thus, before such a projection objective is commissioned, aberrations can be imminent because of unsatisfactory material specifications or inaccuracies in production or assembly. Such imminent aberrations can, however, be very largely removed during the production of the individual optical elements of the objective and during the process of assembly, individual lenses of the objective being provided with aspherized surfaces to this end, in particular.

Aberrations can, however, also arise after commissioning and/or during operation of the projection objective or in the course of the ageing of the projection objective. Such aberrations can be caused by radiation-dependent variations in the optical material of the optical elements of the projection objective. The radiation-dependent variations can be permanent as, for example, in the case of compacting of the material of the optical elements, or they can be only temporary. Temporary variations in the optical material of the optical elements of the projection objective are overwhelmingly based on the fact that the individual optical elements heat up and are therefore deformed during the exposure operation.

It is characteristic of radiation-dependent material variations which institute aberrations that the two-fold symmetry of the rectangular field of the illumination slit and of the image field is transferred to the aberrations. This breaking of the rotational symmetry of the projection objective leads to typical aberrations that are generally difficult to correct.

Typical aberrations that are caused by heating of the material of the optical elements which leads to changes in refractive index and also to surface changes, or which are caused by changes in density (compacting) which can lead via changes in refractive index to wavefront errors are, for example, a constant-field astigmatism, a constant-field occurrence of trefoil aberrations or a constant-field occurrence of quadrafoil aberrations. In addition to constant-field aberrations, however, there is also the occurrence of aberrations that indicate a field dependence or a field profile, for example a one-fold field profile of the distortion (anamorphism) and an astigmatic field profile of the image surface.

It is known that a constant-field astigmatism can be corrected via the astigmatic deformation of a lens.

An actively deformable lens element that can be used to this end is described, for example, in document WO 99/67683. Here, an actively deformable lens is arranged in a mount, the lens being assigned a manipulator that has one or more actuators that act on the lens in a fashion approximately perpendicular to the optical axis. The actuators effect forces and/or torques, which are not rotationally symmetrical and deviate from the radial, on the optical element in order to produce deformations in the form of instances of bending. Depending on how many actuators the manipulator has, it is possible to produce one-fold, two-fold, three-fold, or generally n-fold deformations or instances of bending, in order correspondingly to correct one-fold, two-fold, three-fold or generally n-fold aberrations by deforming the actively deformable lens at least partially.

By contrast with the abovementioned aspherizations of optical elements that can exhibit any desired complicated geometries, in order to correct correspondingly complicated wavefront error profiles, the correction potential of an actively deformable lens tends to be lower and is essentially limited to simple wavefront aberration profiles.

The conventional concepts of the use of actively deformable lenses are limited to the use of a single actively deformable element which is intended to be used to correct a specific induced image defect. It is certainly possible to use this mode of procedure to very largely correct the image defect (aberration) to be corrected by appropriate deformation of the actively deformable lens, but this correction induces or intensifies other image defects, the result of this being that the overall imaging quality of the projection objective is occasionally not improved, or not substantially.

This means that there is still a need for a method for improving the imaging properties of a projection objective that can be used to combat effectively one or more image defects, in particular those that are caused because of material ageing and/or temporary material heating.

It is an object of the present invention to provide such a method.

It is an object, furthermore, of the present invention to provide a projection objective that is improved with regard to imaging properties.

It is, furthermore, an object of the present invention to specify for a microlithography projection objective a method with the aid of which at least one suitable lens can be selected from the plurality of lenses of the projection objective as actively deformable element for at least partially correcting an image defect.

In accordance with a first aspect of the invention, a method for improving the imaging properties of a microlithography projection objective is provided, the projection objective comprising a plurality of lenses between an object plane and an image plane, a first lens of the plurality of lenses being assigned a first manipulator for actively deforming the lens, the first lens being deformed for at least partially correcting an image defect, at least one second lens of the plurality of lenses furthermore being assigned at least one second manipulator, and the second lens being deformed in addition to the first lens.

The method according to the invention is based on providing at least two actively deformable lenses in a projection objective, and this opens up, inter alia, the possibility of correcting primary and higher orders of image defects independently of one another. In contrast, this possibility does not exist when use is made only of one actively deformable lens, this being based on the fact that primary and higher orders of image defects can be linearly dependent on one another. For example, the primary order of the two-fold image defect in Z5 is linearly dependent on the associated next higher order of image defect in Z12. The three-fold image defect in Z11 is, for example, linearly dependent on the next higher order in Z20, and the four-fold image defect in Z17 is linearly dependent on the next higher order in Z28. In this case, Z5, Z12, Z11, Z20, Z17, Z28 are Zernike coefficients which are used as known to classify image defects in a series expansion of the wavefront.

The method according to the invention can be applied to projection objectives in an immersion configuration or in a dry configuration. Furthermore, the method according to the invention can be applied to projection objectives that are not constructed exclusively from refractive elements, that is to say lenses, but can also be applied to those that are constructed from a combination of refractive elements and reflective elements, for example mirrors.

A further advantage of the use of at least two actively deformable lenses for at least partially correcting image defects of a projection objective consists in that, given a suitable selection of the position and/or the geometry of the at least two actively deformable lenses, it is possible to use simple manipulators to produce even more complicated wavefront profiles, something which cannot be done, or can be done only with a substantially increased outlay, with the aid of only one actively deformable lens, because of the limitation, explained above, of the deformability of a lens.

Thus, the first lens and the at least second lens can preferably be adjacent or can be arranged at mutually optically conjugate sites between the object plane and the image plane, both lenses then being deformed such that the deformations exhibit a different deformation profile.

This constitutes an advantageous possibility of at least partially correcting wavefront aberrations with a complicated field profile.

A similar effect can advantageously be achieved when the first lens and the at least second lens are not adjacent or are arranged at not mutually optically conjugate sites between the object plane and the image plane, and both are deformed such that the deformations exhibit a different deformation profile.

Whereas lenses that are arranged at adjacent or at conjugate positions in the projection objective have substantially identical effects on the field profile in the image, nonadjacent lenses or lenses in the projection objective that are arranged at not mutually optically conjugate sites have different effects on the image field. In order in both cases to compensate specific abberative field profiles or constant-field aberrations, the at least two lenses are preferably differently deformed in the former case, and substantially identically deformed in the second case.

The abovenamed deformations of different profile can preferably be achieved by virtue of the fact that the first lens and the at least second lens are of different shape.

If the at least two actively deformable lenses have a different shape or geometry, even introducing identical forces exerted on the two lenses leads to different deformation profiles and thus to different corrective effects.

It is likewise possible to attain deformations of different profiles by virtue of the fact that the first lens and the at least second lens are deformed by introducing different forces.

In particular, the first and the at least second lens can be deformed by introducing oppositely directed forces, in order to attain a specific corrective effect.

When the first lens and the at least second lens are arranged at not mutually optically conjugate sites between the object plane and the image plane, both can be at least substantially identically deformed, and yet the identical deformation can produce a different corrective effect on image defects in the image plane, since the corrective effect of two actively deformable lenses is a function of their position in the projection objective.

Conversely, it is possible when the first lens and the at least second lens are arranged at mutually optically conjugate sites between the object plane and the image plane for both to be substantially differently deformed in order in this way to attain a different corrective effect.

Furthermore, it can advantageously be provided to deform the first lens and the at least second lens at a specific ratio to one another.

If, for example, the first lens and the at least second lens influence the wavefront aberrations in Z5 and Z12 in a constant fashion over the image field, the ratio between Z5 and Z12 being −3, for example, for the first lens, and +2, for example, for the second lens, it is then possible to set a desired ratio x between Z5 and Z12 by selecting the deformation of the second lens in the ratio of 3+x/2−x by comparison with that of the first lens. The absolute magnitude is governed by the desired amplitude of Z5 in the wavefront.

Expressed in general terms, the abovenamed ratio is preferably selected as a function of the influence of the first lens and of the at least second lens on wavefront aberrations of a radially primary Zernike order (for example Z5) and of a radially higher Zernike order (for example Z12) thereof.

It is preferred, furthermore, when the first lens and the at least second lens are selected from the plurality of lenses such that a radially primary Zernike order of the image defect can be corrected substantially independently of a radially higher Zernike order thereof, or vice versa.

As already mentioned at the beginning, there are linear dependencies between the primary Zernike orders and the radially higher Zernike orders of the same image defect, such as between Z5 and Z12, for example, when only one lens is deformed. By suitably selecting the geometry and/or position of the first and at least second lens, this linear dependence can be broken with regard to the wavefront aberration to be corrected.

This can preferably come about by selecting the first and the at least second lens from the plurality of lenses such that the magnitude of the corrective influence of the first lens on the ratio of the radially primary Zernike order and the radially higher Zernike order is approximately equal to the corrective influence of the at least second lens, but has a different sign.

The linear dependence can be broken by the different sign of the corrective influence of the first lens with reference to the corrective influence of the at least second lens in conjunction with the identical magnitude of the corrective influence.

A corrective influence of the first lens and the at least second lens, respectively of different signs, can preferably be implemented by virtue of the fact that the first lens is a positive lens and the at least second lens is a negative lens. The sequence in the direction of the beam path in the projection objective is not important here, that is to say the first lens can be arranged in the beam propagation direction upstream of the at least second lens or downstream thereof.

More specific refinements of the method are described below.

When the image defect comprises a combination of field-dependent and constant-field components or predominantly field-dependent components, there is selected from the plurality of lenses as the first lens and/or as the at least second lens one in the case of which the magnitude of the ratio of the subaperture radii of lens front side and lens rear side is in the range from approximately 0.8 to approximately 0.9 or approximately 1.1 to approximately 1.2 in the case of a negative lens, and in the range from approximately 0.9 to approximately 1.1 in the case of a positive lens.

The subaperture radius of a lens is understood as the radius of the light cone emanating from a field point on the lens front side or the lens rear side. The subaperture radii of lens front side and lens rear side depend on the position of the lens in the projection objective and on their geometry.

In the previously mentioned case that the image defect to be corrected consists of a combination of field-dependent and constant-field components or predominantly field-dependent components, there is selected from the plurality of lenses as the first lens and/or as the at least second lens one in the case of which the magnitude of the ratio of the subaperture radius of lens front side or lens rear side to the maximum lens height is smaller than approximately 0.7 and greater than approximately 0.1.

The ratio of the subaperture radius of the lens front side or lens rear side to the maximum lens height is influenced, in turn, by the position of the lens in the projection objective. Field-dependent components of an image defect such as, for example, in Z2 (anamorphism) can be corrected most effectively by those actively deformable lenses that are positioned closer to a field plane than to a pupil plane, as expressed by the previously mentioned value of approximately 0.7.

In the case when the image defect to be corrected has at least predominantly constant-field components, there is selected from the plurality of lenses as the first lens and/or as the at least second lens one in the case of which the magnitude of the ratio of the subaperture radii of lens front side and lens rear side is in the range from approximately 0.8 to approximately 0.9 or approximately 1.1 to approximately 1.2 in the case of a negative lens, and in the range from approximately 0.9 to approximately 1.1 in the case of a positive lens.

In the case when a positive lens and a negative lens are selected for correcting the image defects, the position of these lenses is preferably selected such that the magnitudes of the beam angles of the marginal rays directly upstream of the positive lens are smaller than the beam angles of the marginal rays directly upstream of the selected negative lens.

It is likewise preferable in this case to select from the plurality of lenses as the first lens and/or as the at least second lens one in the case of which the magnitude of the ratio of the subaperture radius of lens front side or lens rear side to the maximum lens height is greater than approximately 0.7.

Constant-field components are therefore preferably effected by the active deformation of a lens that is closer to a pupil plane than to a field plane, since elements near the pupil exhibit a substantially constant-field effect on the wavefront aberration in the image field.

For the suitable selection of the first lens and/or the at least second lens from the plurality of lenses of the projection objective as an actively deformable element or actively deformable elements, it is preferred to select one in the case of which the ratio of the lens center thickness to maximum lens height is smaller than approximately 0.4.

Here, the maximum height of a lens is understood as the maximum ray height in the lens body. This is generally only slightly smaller than the real overall height of the lens.

Thus, preference is given, however, to thin lenses as actively deformable elements, since in the case of these a deformation can be attained by introducing a relatively weak force, and this advantageously reduces the outlay on assembly and the requirements placed on the manipulator.

When, however, a thin lens as previously described is not present at a suitable position or with a suitable geometry and instead of this there is placed at a position suitable for the selection as actively deformable lens a thick lens that is too thick per se for a deformation, this lens can be split into at least two individual lenses, and at least one of the individual lenses can be deformed.

In a further preferred refinement, it is provided that there is selected from the plurality of lenses as the first lens and/or as the second lens one that is passed through more than once by the light during operation.

The advantage here is that the manifold, for example two-fold passage of the light through such a lens intensifies the optical effect of a deformation of this lens as correction potential, and already virtually doubles it in the case of a two-fold passage. A lens through which light passes twice during operation is present, for example, in catadioptric projection objectives with beam deflection.

In a further preferred refinement, the first lens and the at least second lens is deformed with one-fold, two-fold, three-fold or n-fold symmetry, where n>3.

It is possible in this way for one-fold, two-fold, three-fold or n-fold wavefront aberrations to be at least partially corrected with the aid of actively deformable lenses in accordance with the previously described refinements.

In accordance with a further aspect of the invention, a method is specified for selecting at least one lens of a plurality of lenses of a microlithography projection objective as actively deformable element for at least partially correcting an image defect, wherein the geometry and/or position of the at least one lens in the plurality of lenses are/is used as selection criterion as a function of the image defect to be corrected.

This method is therefore based on the idea of determining in the case of an existing optics design, or one to be drafted, of a projection objective that has a plurality of lenses, at least one, preferably at least two lenses as specified above that are best suited as actively deformable lenses for correcting one or more image defects.

It is preferred to use the property of the at least one lens as positive lens or negative lens as selection criterion for a suitable geometry.

The different effects of a positive lens and a negative lens on wavefront aberrations, in particular on the sign (+/−) of the influence on specific wavefront aberrations, has already been described above.

Furthermore, it is preferred to use the ratio of the center thickness to the maximum lens height as selection criterion for a suitable geometry.

"Maximum lens height" is to be understood as the maximum ray height on the relevant lens. This selection criterion takes account of the suitability of a specific lens of the projection objective to be capable of being deformed in a suitable way by means of a manipulator without the need to operate by introducing strong forces.

It is preferred in this case to select a lens in the case of which the ratio of the center thickness to the maximum lens height is smaller than approximately 0.4.

A further preferred selection criterion for a suitable position of the at least one lens is the ratio of subaperture radii of the lens front side and lens rear side.

If the image defect comprises at least predominantly constant-field components, there is selected as the at least one lens one in the case of which the magnitude of the ratio of subaperture radii of the lens front side and lens rear side is in the range from approximately 0.8 to approximately 0.9 or approximately 1.1 to approximately 1.2 in the case of a negative lens, and in the range from approximately 0.9 to approximately 1.1 in the case of a positive lens.

If the image defect is a combination of field-dependent and constant-field or of predominantly field-dependent components, there is selected as the at least one lens one in the case of which the magnitude of the ratio of the subaperture radii of lens front side and lens rear side is in the range from approximately 0.8 to approximately 0.9 or approximately 1.1 to approximately 1.2 in the case of a negative lens, and in the range from approximately 0.9 to approximately 1.1 in the case of a positive lens.

A further preferred selection criterion for a suitable position of the at least one lens is the ratio of the subaperture radius of the lens front side or lens rear side to the maximum lens height.

If the image defect comprises at least predominantly constant-field components, there is selected as the at least one lens one in the case of which the magnitude of the ratio of the subaperture radius of lens front side or lens rear side to the maximum lens height is greater than approximately 0.7.

If the image defect is a combination of field-dependent and constant-field or of predominantly field-dependent components, there is selected as the at least one lens one in the case of which the magnitude of the ratio of the subaperture radius of lens front side or lens rear side to the maximum lens height is smaller than 0.7.

A further selection criterion can be whether the at least one lens is passed through more than once by the light during operation of the projection objective.

As already mentioned above, such lenses can preferably be selected as actively deformable lenses that are passed through by the light more than once, for example twice, as can be provided in the case of catadioptric projection objectives.

In accordance with a further aspect of the invention, there is provided a microlithography projection objective, comprising a plurality of lenses that are arranged between an object plane and an image plane of the objective, wherein a first manipulator for actively deforming a first lens is assigned to the first lens from the plurality of lenses, the first lens being deformable for at least partially correcting an aberration, at least one second manipulator further being assigned to at least one second lens from the plurality of lenses, and the at least second lens being deformable in addition to the first lens.

In the case of the projection objective according to the invention, it is possible in accordance with the preferred refinements of the projection objective that are specified in the claims to apply the previously described method in order to improve the imaging properties of the projection objective.

Further advantages and features emerge from the following description and the attached drawing.

It is self-evident that the abovementioned features and those still to be explained below can be used not only in the respectively specified combination, but also in other combinations or on their own without departing from the scope of the present invention.

The present invention is explained below in more detail with the aid of selected exemplary embodiments. In the drawing:

FIG. 2 shows a negative lens and a positive lens for the purpose of illustrating the different correction effects or wavefront effects of a negative lens and a positive lens when these are actively deformed;

Figure 6A:
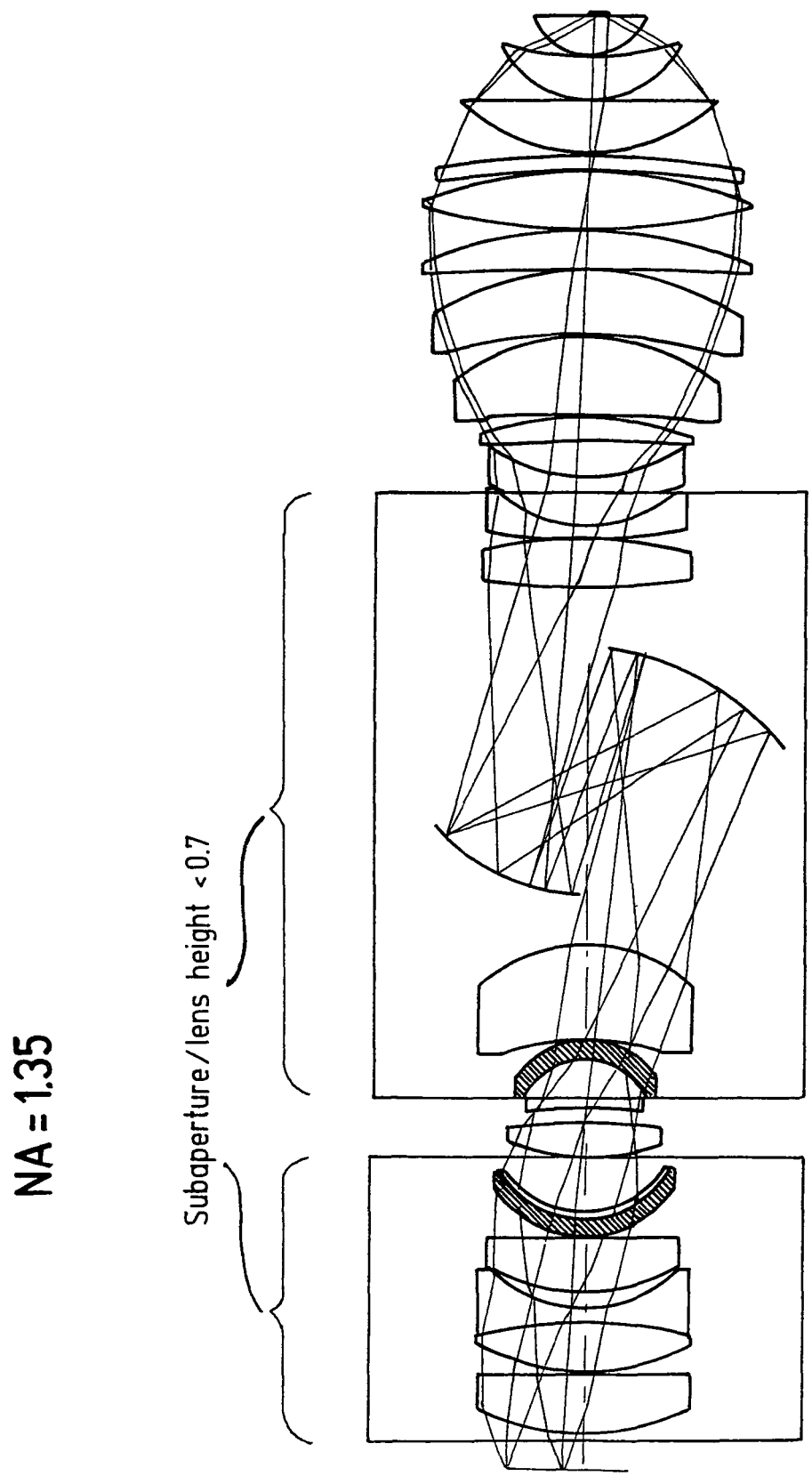
Figure 7B:
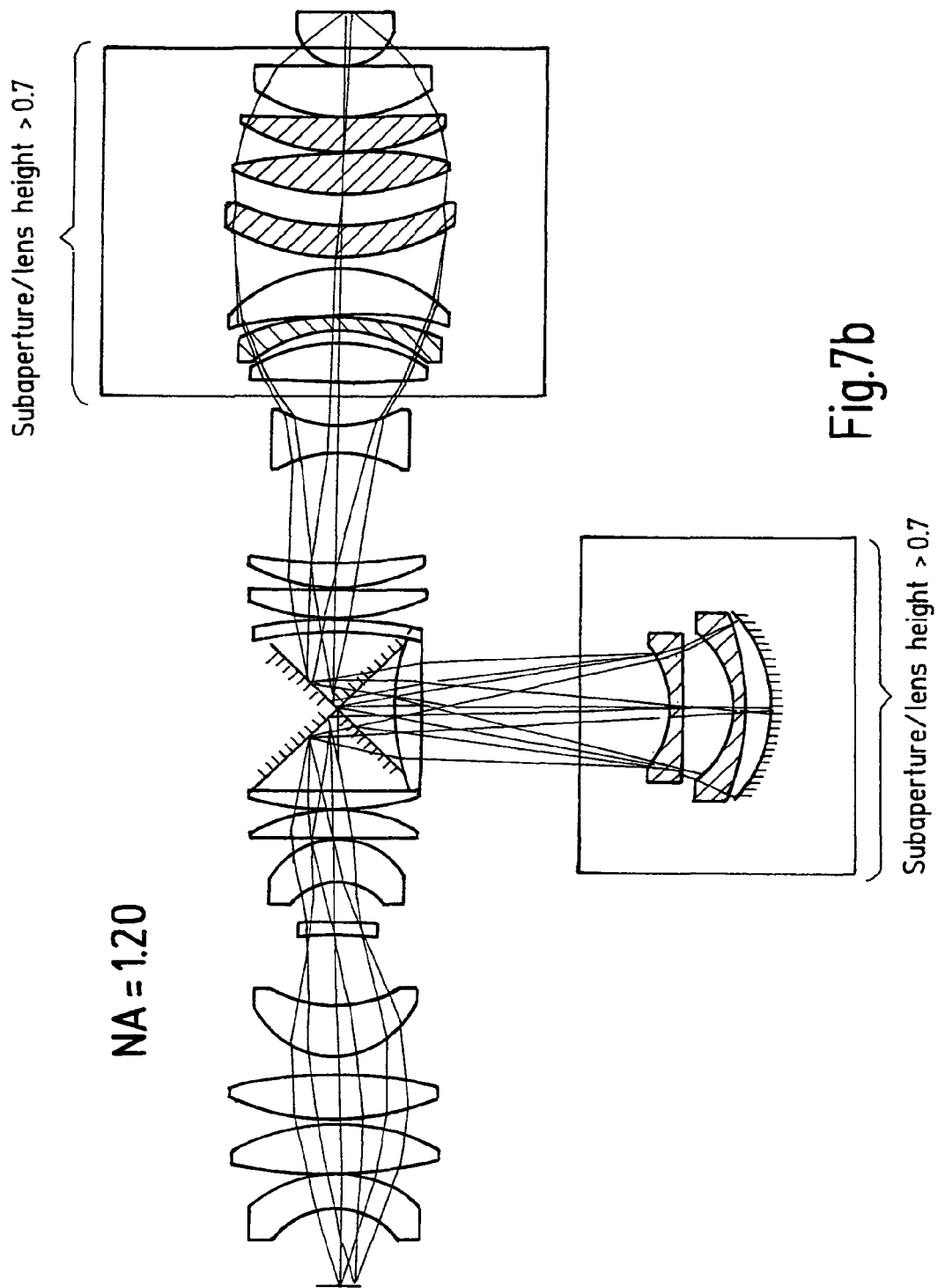
Figure 8A:
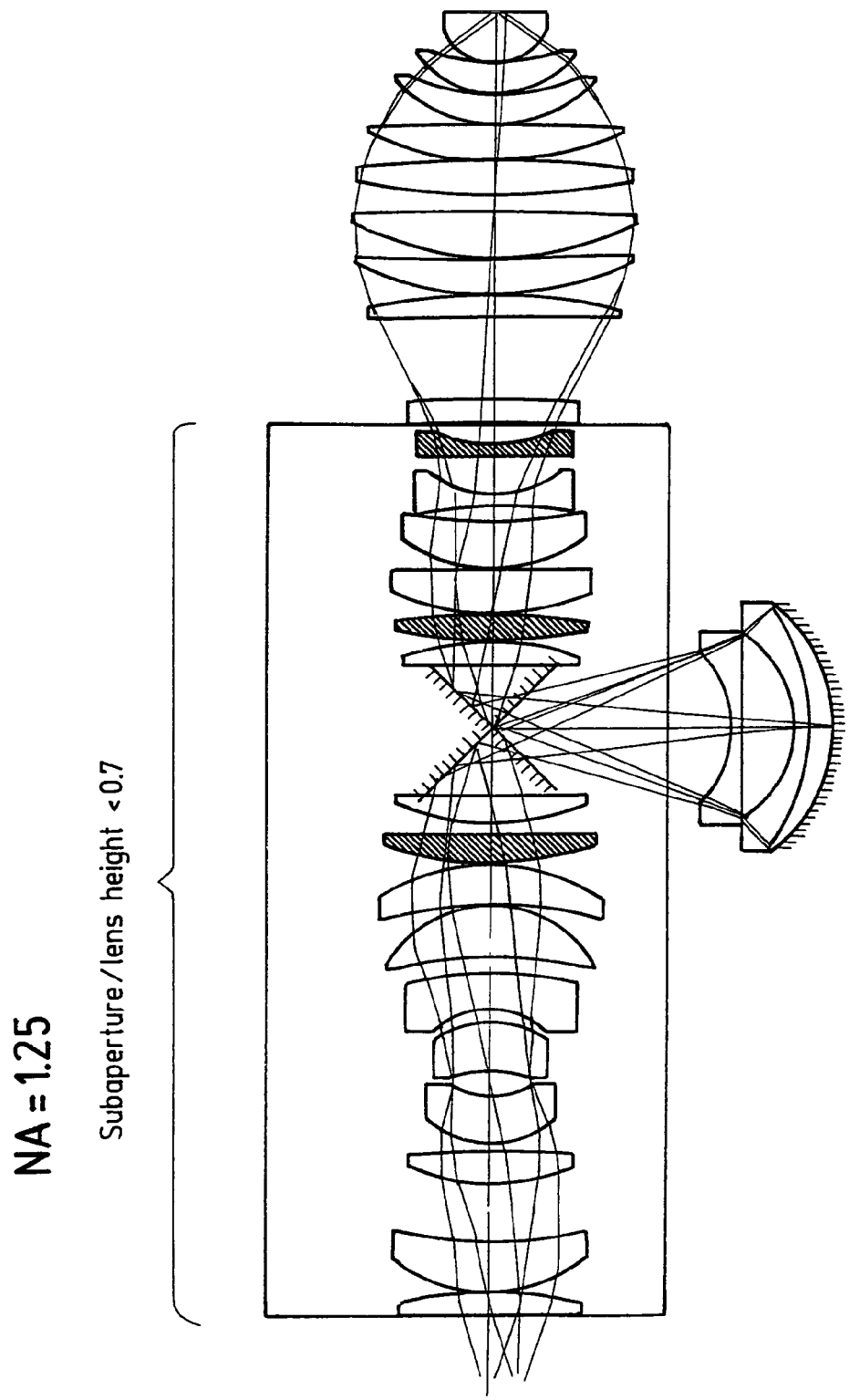
Figure 9A:
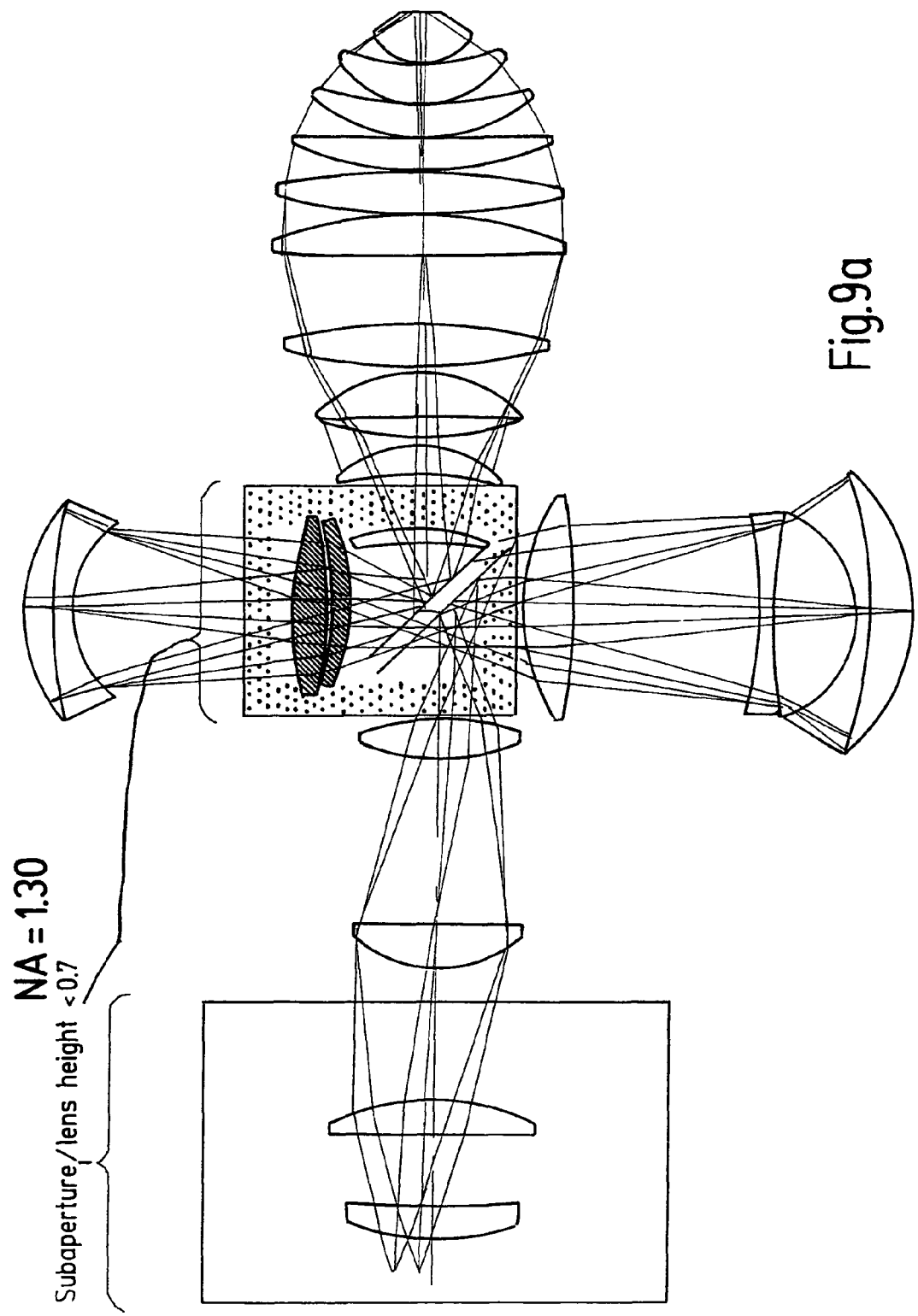
Figure 10A:
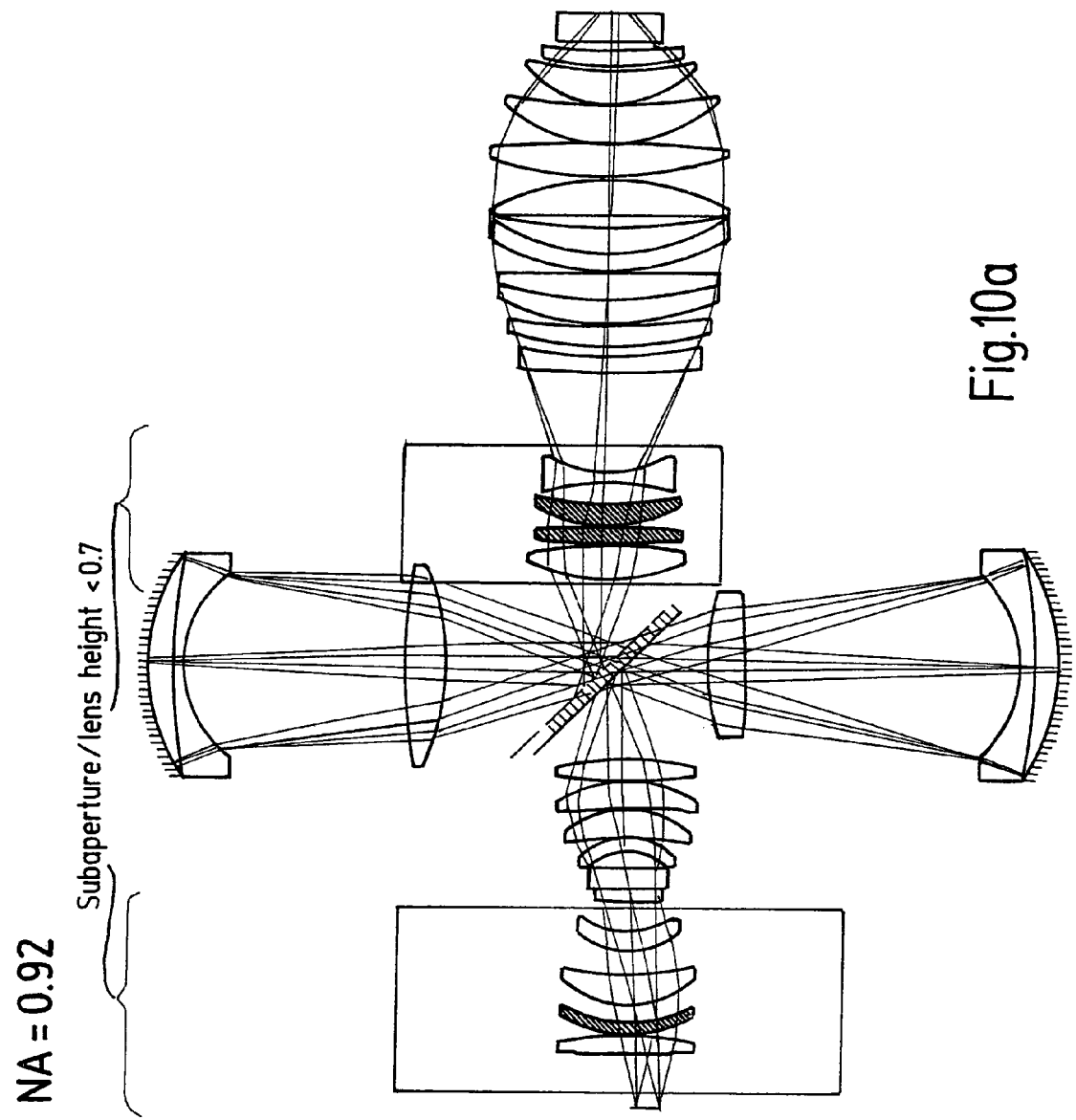
Figure 11A:
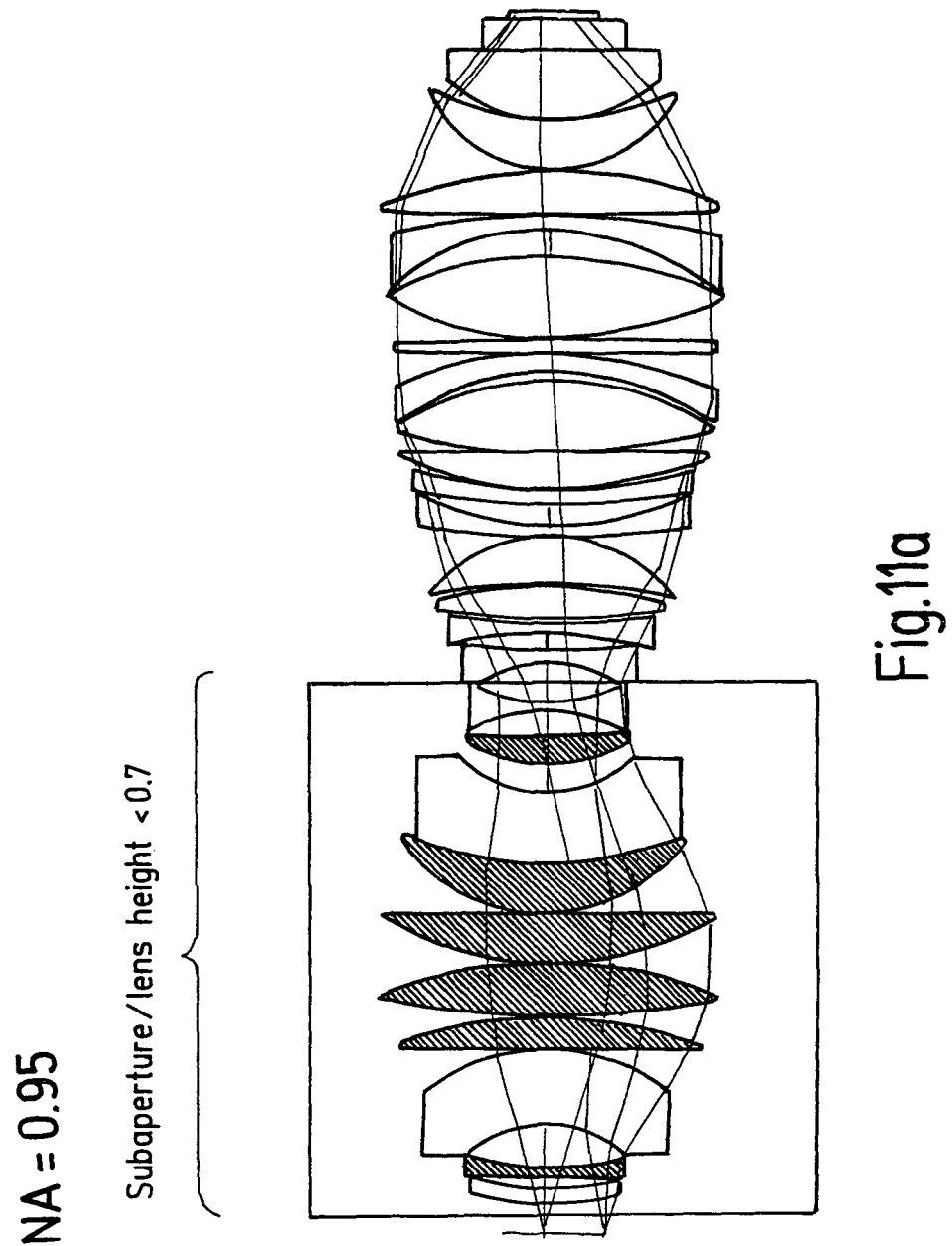

FIGS. 4a) and 4b) show an exemplary embodiment of a projection objective, there being emphasized in FIG. 4a) specific lenses of the projection objective that are suitable as actively deformable lenses for correcting an image defect or a number of image defects that has or have field-dependent components, while there are emphasized in FIG. 4b) lenses of the projection objective that are suitable as actively deformable lenses for correcting an image defect or image defects that has or have the overwhelmingly constant-field components;

FIGS. 5a) and 5b) show a further exemplary embodiment of a projection objective in an illustration similar to FIGS. 4a) and 4b);

FIGS. 6a) and 6b) show a further exemplary embodiment of a projection objective in an illustration similar to FIGS. 4a) and 4b);

FIGS. 7a) and 7b) show a further exemplary embodiment of a projection objective in an illustration similar to FIGS. 4a) and 4b);

FIGS. 8a) and 8b) show a further exemplary embodiment of a projection objective in an illustration similar to FIGS. 4a) and 4b);

FIGS. 9a) and 9b) show a further exemplary embodiment of a projection objective in an illustration similar to FIGS. 4a) and 4b);

FIGS. 10a) and 10b) show a further exemplary embodiment of a projection objective in an illustration similar to FIGS. 4a) and 4b); and FIGS. 11a) and 11b) show a further exemplary embodiment of a projection objective in an illustration similar to FIGS. 4a) and 4b).

In order in the case of a microlithography projection objective that is constructed from a plurality of lenses to correct image defects that can occur on the basis of heating during operation or ageing of the material of the optical elements, it is provided in the method according to the invention to select at least two lenses from the plurality of lenses of the projection objective and to deform them actively via manipulators in order at least partially to correct image defects that occur.

Irrespective of whether at least two lenses are selected as actively deformable lenses, or whether only one lens is selected as actively deformable lens, a further aspect of the present invention consists in specifying suitable criteria for selecting such a lens as actively deformable lens.

The aspect of the present invention mentioned in the first instance and in accordance with which at least two lenses are selected from the plurality of lenses as actively deformable lenses will firstly be explained in more detail.

If only one lens is used as actively deformable lens for correcting an image defect, only a relatively simple wavefront influence can be produced by the deformation of the individual lens onto the wavefront in the image field. If, by contrast, two or more adjacent lenses or lenses arranged at conjugate positions in the system are combined with one another such that these lenses have deformations of different sign, for example on the basis of a different shape of the lenses and/or a different introduction of forces by the manipulator or manipulators and, if appropriate, of different sign, for example because of introducing oppositely directed forces, it is possible for there to arise in the combination of the different profiles of the deformations of the at least two lenses a complicated wavefront influence such as cannot be attained with the aid of a single deformable lens.

The same result can be achieved when two or more actively deformable lenses are deformed at different positions in the projection objective, these selected lenses being able to have similar deformations, but having different wavefront influences owing to the different positions in the projection objective.

Figure 1:
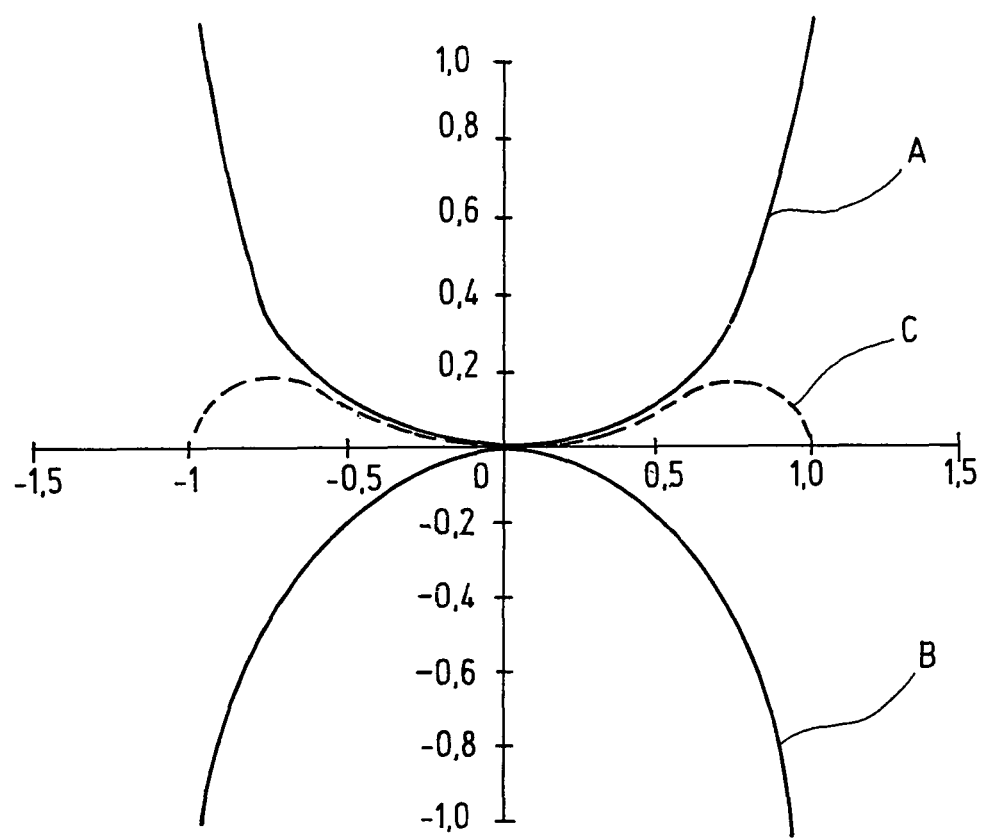
FIG. 1 shows a diagram that illustrates wavefront effects in the case of a combination of two lenses of different deformation, or at different positions in the projection objective.

This is illustrated in FIG. 1 for a simple case. Illustrated in the top curve A is a wavefront influence, assumed to be quadratic, of a first lens of the plurality of lenses of a projection objective.

Illustrated in the lower curve B is a wavefront influence of an actively deformed second lens that shows a dependence of fourth power and, moreover, differs from the wavefront influence in accordance with curve A by the opposite sign.

The curve C illustrated with a broken line now shows the super-position, resulting as a sum, of the wavefront influences in accordance with curves A and B, which shows a more complicated field profile than the individual wavefront influences of the first lens and of the second lens, taken alone. It is possible in this way by combining two or more lenses and by appropriate deformation to produce a complicated field profile of the wavefront in order at least partially to compensate wavefront aberrations in the image field.

It is possible in this case, in particular, to deform the first lens and the at least second lens at a specific ratio to one another. This ratio is selected as a function of the influence of the first lens and of the at least second lens on wavefront aberrations of a radially primary Zernike order and of a radially higher Zernike order thereof.

This is explained by the example of the primary Zernike order Z5 and of the radially next higher Zernike order Z12 thereof.

It may be assumed that the first lens produces a wavefront influence in the case of which the ratio between Z5 and Z12 is −3. It may further be assumed that this ratio is +2 for the second lens. A desired ratio x between Z5 and Z12 can then be set by selecting the deformation of the second lens at the ratio of 3+x/2−x by comparison with that of the first lens. The magnitude is governed by the desired amplitude of Z5 (or Z12) in the wavefront.

When using actively deformable lenses that are deformed in one-fold, two-fold or three-fold or higher-fold fashion with respect to symmetry to correct image defects of a projection objective that can arise, for example, during operation by heating of the optical elements, it is to be borne in mind that if only one actively deformable lens is used for correction the primary Zernike orders and the associated higher Zernike orders are linearly dependent on one another.

Thus, for example, the image defects having two-fold symmetry in accordance with the primary Zernike order Z5, and the radially higher Zernike order Z12, are dependent on one another, and likewise the three-fold primary Zernike order Z11 and the three-fold Zernike order Z20 are dependent, and the four-fold Zernike order Z17 is dependent on the radially higher four-fold Zernike order Z28.

It is not possible to correct Z12 independently of Z5 on the basis of this linear dependence between first and higher orders, for example in the case of image defects having two-fold symmetry, with the aid of only one actively deformable lens, it being possible as a result for one of the two Zernike coefficients to rise considerably after correction. A rational optimization is therefore impossible.

A rational correction of such image defects is possible, however, when at least two lenses are selected for correction purposes as actively deformable lenses within the projection objective. Of course, it is also possible to select more than two lenses as actively deformable lenses, use being made, in particular, of an even number of such lenses. By using at least two lenses as actively deformable lenses, there is a possibility of setting primary and radially higher orders independently of one another.

In order to ensure such an independence of the correction from primary and radially higher orders, the corrective influences of the two lenses must have different signs, but should be similar in terms of magnitude.

It is correspondingly necessary to place specific demands on the geometry and position of the selected lenses in the projection objective.

This results in various selection criteria for the selection of suitable lenses from the plurality of lenses of a projection objective as actively deformable lenses for correction of image defects.

It is possible to achieve a correction that is independent with reference to a first Zernike order and to a radially higher Zernike order relevant thereto by making the first lens a negative lens, for example, and the second lens a positive lens, for example. This is described in more detail hereinafter with reference to FIG. 2.

FIG. 2 illustrates a negative lens 10 and a positive lens 12.

A light ray 14 impinges on a lens front side 16 of the negative lens 10.

Continuous lines illustrate the negative lens 10 in the nondeformed state, and broken lines illustrate it in the deformed state, which has been brought about by means of a manipulator 21.

The propagation of the impinging light ray 14 inside the negative lens 10 takes place in the nondeformed state in accordance with line 18, in the deformed state in accordance with line 20. After exiting from the rear side 22 of the negative lens 10, the light ray propagates further in accordance with a line 24 in the nondeformed state of the negative lens 10, and in accordance with a line 26 in the deformed state. 28 denotes the front side of the positive lens 12, and 30 the rear side. Continuous lines illustrate the positive lens 12 in the nondeformed state, and broken lines illustrate it in the deformed state. Deformation of lens 12 is accomplished by manipulator 31. An impinging light ray 32 propagates in accordance with lines 34 and 36 in the nondeformed state of the positive lens 12, and in accordance with lines 38 and 40 in the deformed state.

It is assumed below that the deformation of the negative lens 10, as also the deformation of the positive lens 12, is a quadratic function of the distance r perpendicular to the optical axis z.

It then holds approximately for the lens thickness d(r) arising after deformation that $$d(r) \approx d_0(1 + ar^2) \text{ where } a = \frac{1}{2d_0}\left(\frac{1}{R_H} - \frac{1}{R_V}\right),$$

$d_0$ being the center thickness of the negative lens 10 or the positive lens 12, and $R_V$ being the radius of curvature of the lens front side 16 or 28, and $R_H$ being the radius of curvature of the lens rear side 22 or 30.

An n-fold wavefront deformation WFD can be described approximately via the subaperture radius $R_S$ at the respective lens front side 16 or 28, and the respective lens rear side 22 or 30, as $$\text{WFD} \approx (1 + aR_S^2)^n.$$

Since the radii of curvature $R_H$ and $R_V$ are affected by sign, and since these signs differ from one another correspondingly between the negative lens 10 and the positive lens 12, is a>0 for the negative lens 10 and a<0 for the positive lens 12.

Assuming that the deformation with n-fold symmetry that is imposed on the negative lens 10 and the positive lens 12 is two-fold (n=2), it follows approximately for the wavefront deformation WFD that:

$$\text{WFD} \approx 1 + 2aR_S^2 + a^2R_S^4.$$

Turning now to the contributions of the wavefront deformation WFD to the primary Zernike order Z5 and to the radially higher Zernike order Z12, it holds for the negative lens 10 that:

$$\text{WFD} \approx a_5 Z5 + a_{12} Z12, \text{ and}$$

for the positive lens 12 that:

$$\text{WFD} \approx -a_5 Z5 + a_{12} Z12.$$

If the deformations are selected such that the contributions $a_5$ to the Zernike coefficient Z5 in the wavefront deformation are equal, the contributions of the wavefront deformation to Z5 eliminate one another, and the wavefront deformation in the order Z12 can be attacked independently of the first Zernike order Z5.

Conversely, it is also possible, of course, to proceed in such a way that the contributions of the wavefront deformation in Z12 eliminate one another, and the contributions in Z5 relating to the correction of Z5 add up to a finite value such that Z5 can be corrected independently of Z12 in this case.

In addition to the geometry of the lenses to be selected as actively deformable lenses inside a projection objective, importance attaches to further selection criteria for selecting suitable lenses as actively deformable lenses that are described hereinafter with reference to FIG. 3.

The optical effect of a lens or of a deformation of the latter on wavefront deformations in the image field also depends on the position of the lens inside the projection objective.

The optical effect of a deformation of a lens, which depends on the position of the lens inside the projection objective, is influenced at least inter alia by the ratio of the subapertures at the lens front side and the lens rear side, as well as by the ratio of the subaperture at the front or rear side (or the larger of these two) to the maximum height of the lens.

Figure 3:
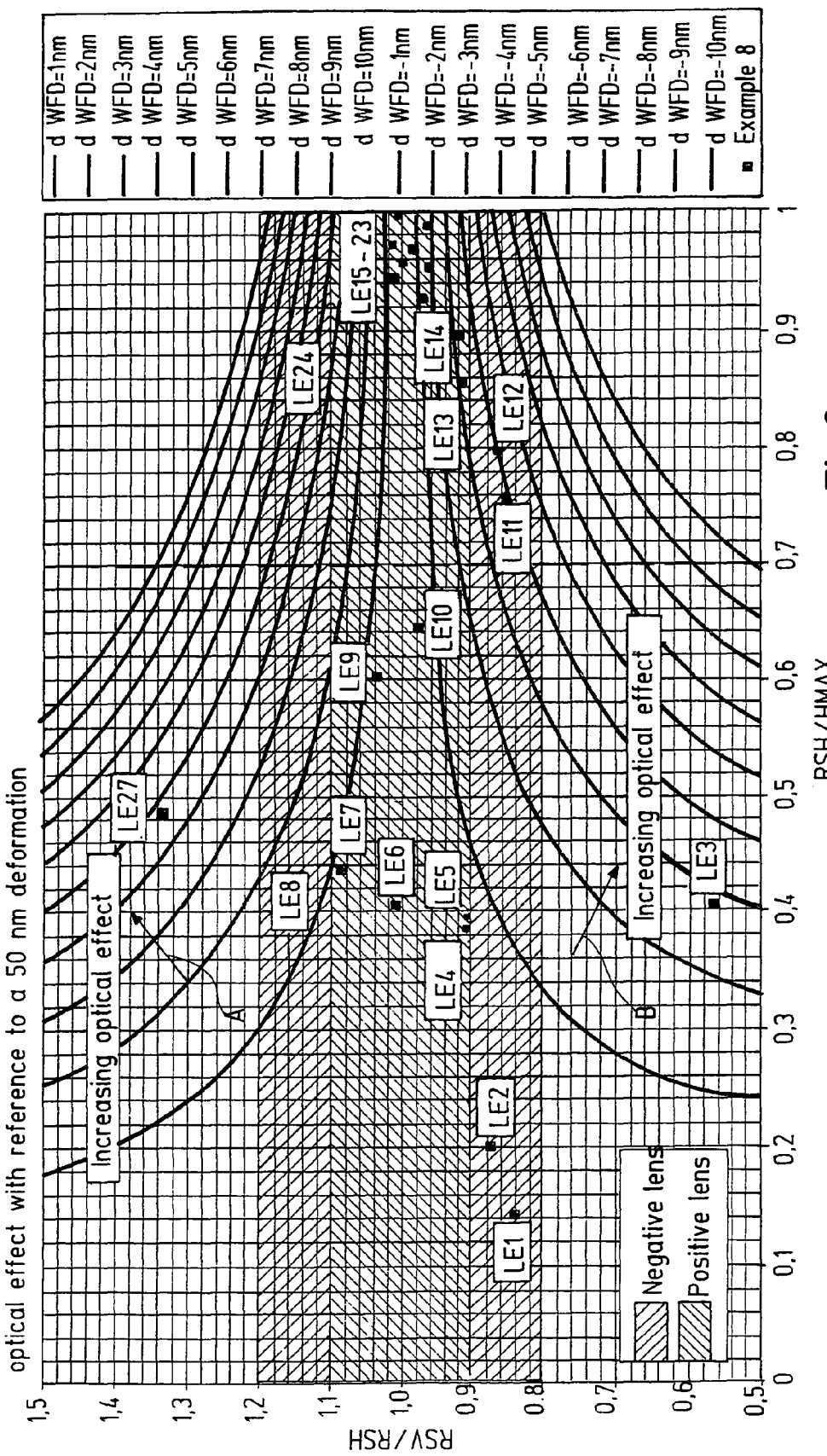
FIG. 3 shows a diagram that illustrates the relationship between the optical effect of a deformation as a function of the subapertures of various lenses within a projection objective such as is represented in FIG. 11.

FIG. 3 shows a diagram that illustrates the relationship between a deformation and the optical effect as a function of the subapertures of various lenses.

The abscissa of the diagram shows the ratio of subaperture (at the lens front side or lens rear side, or the larger of these two) to the maximum lens height, this ratio naturally being incapable of exceeding 1.

The ordinate of the diagram shows the ratio of the subaperture at the lens front side to the subaperture at the lens rear side.

23 lenses LE1 to LE23 are assigned to the value pairs $(R_{SV}/R_{SH}; R_{SH}/H_{max})$ in the diagram. The lenses LE1 to LE23 belong to the projection objective, as is illustrated in FIGS. 12a) and 12b), respectively. The enumeration of the lenses LE1 to LE23 corresponds to the sequence of the lenses in the illustration of FIGS. 12a) and 12b), from left to right, that is to say from the object plane to the image plane.

Also plotted in the diagram are lines, each line illustrating an identical optical effect of a deformation for the value pairs $(R_{SV}/R_{SH}; R_{SH}/H_{max})$.

The direction of the increase in the optical effect is illustrated by arrows A and B.

The optical effect is a measure of the resulting wavefront deformation that results in the case of a deformation assumed to be identical for all lenses. An increasing resulting wavefront deformation signifies an increasing optical effect.

Also plotted in FIG. 3 is a frame that illustrates the range of the value pairs $(R_{SV}/R_{SH}; R_{SH}/H_{max})$ in which deformations in the lenses present there have the largest optical effect on constant-field and field-dependent wavefront deformations. These are the lenses LE11 to LE23 with reference to constant-field wavefront deformations. This range includes lenses for which the ratio of subaperture at the lens front side or lens rear side to the maximum lens height is larger than approximately 0.7, and in the case of which the ratio of the subaperture at the lens front side and the subaperture at the lens rear side is in the range from approximately 0.9 to approximately 1.1 for positive lenses, and in the range from approximately 0.8 to approximately 0.9 and from approximately 1.1 to approximately 1.2 in the case of negative lenses.

It may be inferred correspondingly that in order to correct image defects that have overwhelmingly field-dependent components or consist of a combination of field-dependent and constant-field components, there are selected as actively deformable lenses ones for which the ratio of the subaperture to maximum lens height is smaller than approximately 0.7, and in the case of which the ratio of subaperture at the lens front side to subaperture at the lens rear side is in the range from approximately 0.9 to approximately 1.1 for positive lenses, and in the range from approximately 0.8 to approximately 0.9 or from approximately 1.1 to approximately 1.2 for negative lenses. This is shown in FIG. 3 for the lenses LE1 to LE10.

Further selection criteria for lenses to be selected as actively deformable lenses are the lens thickness, in which case the ratio of the center thickness of the lens to lens height should be smaller than approximately 0.4, and whether, during operation of the projection objective, the light passes through the corresponding lens not only once, but twice or several times, since in the latter case the optical effect is virtually doubled or multiplied with each passage.

FIGS. 4a) to 11b) illustrate exemplary embodiments of projection objectives in the case of which the previously described concepts of the correction of aberrations by means of actively deformable lenses are illustrated.

FIGS. 4a) and 4b) show a projection objective 50 such as is described in document DE 102 10 899. The projection objective 50 has a numerical aperture NA of 1.1.

In the following sequence of optically effective modules, the projection objective 50 includes in the sense of the passage of light, a first, purely dioptric part of positive refractive power, a biconcave lens that is arranged in the middle region of the projection objective 50, and a third, purely dioptric part of positive refractive power.

The maximum radius Y' that an image point can have in the case of this projection objective 50 is 11.0 mm.

FIG. 4a) emphasizes the region of the projection objective 50 in which for the lenses present there the ratio of the subaperture at the respective lens to the maximum lens height is smaller than approximately 0.7.

In this region, the lenses present there can be selected as actively deformable lenses for correcting aberrations which are then to be assigned appropriate manipulators $M_1, \ldots, M_n$ ($n \geq 1$), in order at least partially to correct overwhelmingly field-dependent image defects or combinations of constant-field and field-dependent image defects (for example astigmatism on the axis and anamorphism) that can be produced by lens heating or lens ageing.

Illustrated with a dark background in FIG. 4a) are those lenses that are suitable as actively deformable lenses for correcting image defects. Those that have no dark background, and thus, to be sure, meet the selection criterion that the ratio of the subaperture to maximum lens height is smaller than approximately 0.7, are less suited as actively deformable lenses, for other reasons. For example, the lens L4 is too thick as an actively deformable lens, but in this case the lens L4 could be split into two individual lenses, and one of these two individual lenses or both can then be selected as actively deformable lenses.

It is also to be seen from FIG. 4a) that negative lenses such as, for example, the lenses L1, L2 and L3 can be selected as actively deformable lenses, and the lenses L7 and L8 can be selected as positive lenses.

The lenses with a dark background in FIG. 4a) can be used as actively deformable lenses for correcting those image defects that, as previously mentioned, have overwhelmingly field-dependent components.

The same projection objective 50 is illustrated in FIG. 4b), lenses now being illustrated by hatching in the case of which the ratio of subaperture at the respective lens to maximum lens height is larger than approximately 0.7. These lenses illustrated by hatching, which include, in turn, negative lenses and positive lenses, can be selected as actively deformable lenses for correcting those image defects that overwhelmingly have constant-field components, for example Z5, Z11, Z17 etc. Appropriate manipulaters $K_n, \ldots, K_m$ ($m \geq 1$) are provided for deforming one ore more of the lenses selected for deforming.

FIGS. 5 to 11 feature further exemplary embodiments of projection objectives that are to be interpreted in a fashion similar to FIGS. 4a) and 4b). The manipulators for deforming the lenses of the objectives which are depicted in FIGS. 5 to 11 with dark background or by hatching, are not shown in FIGS. 5 to 11, but are provided as illustrated in FIGS. 4a) and 4b).

The projection objective illustrated in FIGS. 5a) and 5b) is described in document WO 2004/019128 A, just like the projection objective illustrated in FIGS. 8a) and 8b).

Figure 6B:
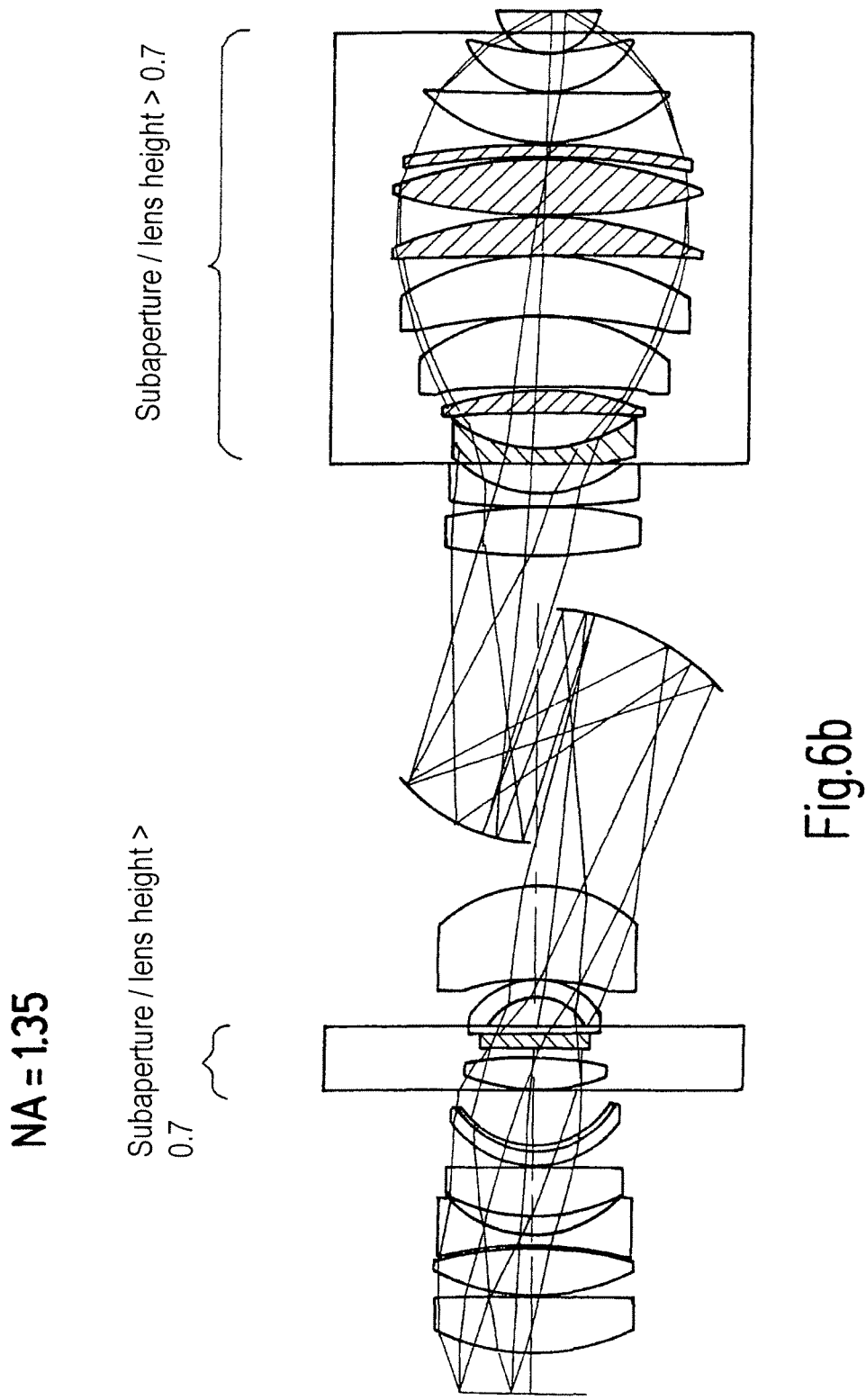

In the sense of the passage of light, the projection objective illustrated in FIGS. 6a and 6b) has in the following sequence of optically effective modules a first, purely dioptric part that images the object plane onto a first intermediate image via a first pupil plane, a second, purely catoptric part that images the first intermediate image onto a second intermediate image via a second pupil plane and that has two concave mirrors upstream and downstream of the second pupil plane, respectively, and a third, dioptric part that images the second intermediate image onto the image plane via a third pupil plane. The projection objective in accordance with FIGS. 6a) and 6b) has a numerical aperture NA=1.35, the maximum radius Y' that an image point can have for this projection objective being 16.25 mm.

In the sense of the passage of light, the projection objective illustrated in FIGS. 7a) and 7b) has in the following sequence of optically effective modules a first, catadioptric part that images the object plane onto a first intermediate image via a first pupil plane, a second, catadioptric part that images the first intermediate image onto a second intermediate image via a second pupil plane, and a third catadioptric part that images the second intermediate image onto the image via a third pupil plane. The numerical aperture of this projection objective is NA=1.20, a maximum radius that an image point can have for this projection objective being 14.4 mm.

The projection objective illustrated in FIGS. 8a) and 8b) corresponds to the design principle previously described with reference to FIGS. 7a) and 7b), this projection objective having a numerical aperture of NA=1.25, a maximum radius Y' that an image point can have for this projection objective being 15.0 mm.

In the sense of the passage of light, the projection objective illustrated in FIGS. 9a) and 9b) has in the following sequence of optically effective modules a first, dioptric part that images the object plane onto a first intermediate image via a first pupil plane, a second, catadioptric part that images the first intermediate image onto a second intermediate image via a second pupil plane, a third, catadioptric part that images the second intermediate image onto a third intermediate image via a third pupil plane, and a fourth, catadioptric part that images the third intermediate image onto the image via a fourth pupil plane. The projection objective has a numerical aperture of NA=1.30, a maximum radius Y' that an image point can have for this projection objective being 15.75 mm.

The projection objective illustrated in FIGS. 10a) and 10b) corresponds to the design principle according to the projection objective in accordance with FIGS. 9a) and 9b), this projection objective having a numerical aperture of NA=0.92, and a maximum radius Y' that an image point can have for this projection objective being 16.1 mm.

The projection objective illustrated in FIGS. 10a) and 10b) is described in document JP 2004 317534 A.

Finally, the projection objective illustrated in FIGS. 11a) and 11b) has a design principle that was described above with reference to the projection objective in FIGS. 4a) and 4b). This projection objective has a numerical aperture of NA=0.95, a maximum radius Y' that an image point can have for this projection objective being 14.0 mm.

The numerical apertures NA and the maximum radii Y' that an image point can have for the respective projection objective are summarized in the following table:

|                        | NA   | 2Y'/mm |
|------------------------|------|--------|
| FIG. 4a) and 4b)       | 1.10 | 22.0   |
| FIG. 5a) and 5b)       | 1.00 | 36.0   |
| FIG. 6a) and 6b)       | 1.35 | 32.5   |
| FIG. 7a) and 7b)       | 1.20 | 28.8   |
| FIG. 8a) and 8b)       | 1.25 | 30.0   |
| FIG. 9a) and 9b)       | 1.30 | 31.5   |
| FIG. 10a) and 10b)     | 0.92 | 32.2   |
| FIG. 11a) and 11b)     | 0.95 | 28.0   |

The invention claimed is:

1. A method, comprising:
   deforming a first lens of a plurality of lenses via a first manipulator; and
   deforming a second lens of the plurality of lenses via a second manipulator,
   wherein a microlithography projection objective comprises the plurality of lenses between an object plane of the microlithography projection objective and an image plane of the microlithography projection objective; and
   wherein:
   a) deformation of the first lens and the second lens corrects a radially primary Zernike order of an image defect substantially independently of a radially higher Zernike order of the image defect; or b) deformation of the first lens and the second lens corrects the radially higher Zernike order of the image defect substantially independently of the radially primary Zernike order of the image defect.

2. The method of claim 1, wherein the first lens and the second lens are not adjacent or are arranged at not mutually optically conjugate sites between the object plane and the image plane, and both are deformed such that the deformations exhibit a different deformation profile.

3. The method of claim 2, wherein the first lens and the second lens are of different shape.

4. The method of claim 2, wherein the first lens and the second lens are deformed by introducing different forces.

5. The method of claim 2, wherein the first and the second lens are deformed by introducing oppositely directed forces.

6. The method of claim 1, wherein the first lens and the second lens are arranged at not mutually optically conjugate sites between the object plane and the image plane, and are at least substantially identically deformed.

7. The method of claim 1, wherein the first lens and the second lens are deformed at a specific ratio to one another.

8. The method of claim 7, wherein the ratio is selected as a function of the influence of the first lens and of the second lens on wavefront aberrations of a radially primary Zernike order and of a radially higher Zernike order thereof.

9. The method of claim 1, wherein the first lens and the second lens are selected from the plurality of lenses such that the magnitude of the corrective influence of the first lens on the ratio of the radially primary Zernike order and the radially higher Zernike order is approximately equal to the corrective influence of the second lens, but has a different sign.

10. The method of claim 9, wherein the first lens is a positive lens and the second lens is a negative lens.

11. The method of claim 10, wherein the magnitudes of the beam angles of marginal rays directly upstream of the positive lens are smaller than the beam angles of marginal rays directly upstream of the negative lens.

12. The method claim 1, wherein, during operation of the microlithography projection objective, the light passes through at least one lens more than once, and wherein the at least one lens comprises a member selected from the group consisting of the first lens and the second lens.

13. The method of claim 1, wherein the first lens and the second lens is deformed with onefold, two-fold, three-fold or n-fold symmetry where n>3.

14. The method of claim 1, wherein deforming the first and second lenses corrects the radially primary Zernike order of the image defect substantially independently of the radially higher Zernike order of the image defect.

15. The method of claim 1, wherein deforming the first and second lenses corrects the radially higher Zernike order of the image defect substantially independently of the radially primary Zernike order of the image defect.

16. A system, comprising:
a microlithography projection objective, comprising:
a plurality of lenses that are arranged between an object plane of the microlithography projection objective and an image plane of the microlithography projection objective, the plurality of lenses including a first lens and a second lens;
a first manipulator configured to actively deform the first lens; and
a second manipulator configured to actively deform the second,
wherein when the first lens and the second lens are deformed during use of the microlithography projection objective:
a) a radially primary Zernike order of an image defect is corrected substantially independently of a radially higher Zernike order of the image defect; or
b) the radially higher Zernike order of the image defect is corrected substantially independently of the radially primary Zernike order of the image defect.

17. The system of claim 16, wherein the first lens and the second lens are not adjacent or are arranged between the object plane and the image plane at not mutually optically conjugate sites and are both deformable such that the deformations exhibit a different deformation profile.

18. The system of claim 17, wherein the first lens and the second lens are of different shape.

19. The system of claim 17, wherein the first lens and the second lens are deformable by introducing different forces.

20. The system of claim 17, wherein the first and the second lens are deformable by introducing oppositely directed forces.

21. The system of claim 16, wherein the first lens and the second lens are arranged at not mutually optically conjugate sites between the object plane and the image plane and are at least substantially identically deformable.

22. The system of claim 16, wherein the first lens and the second lens are deformable at a specific ratio relative to one another.

23. The system of claim 16, wherein the first and the second lens are selected from the plurality of lenses such that the magnitude of the corrective influence of the first lens on the ratio of the radially primary Zernike order and the radially higher Zernike order is approximately equal to the corrective influence of the at least second lens, but has a different sign.

24. The system of claim 23, wherein the first lens is a positive lens and the second lens is a negative lens.

25. The system of claim 24, wherein the magnitudes of the beam angles of the marginal rays directly upstream of the positive lens are smaller than the beam angles of the marginal rays directly upstream of the negative lens.

26. The system of claim 16, wherein, during operation of the microlithography projection objective, the light passes through at least one lens more than once, and the at least one lens comprises a member selected from the group consisting of the first lens and the second lens.

27. The system of claim 16, wherein, when the first lens and the second lens are deformed during use of the microlithography projection objective, the radially primary Zernike order of the image defect is corrected substantially independently of the radially higher Zernike order of the image defect.

28. The system of claim 16, wherein, when the first lens and the second lens are deformed during use of the microlithography projection objective, the radially higher Zernike order of the image defect is corrected substantially independently of the radially primary Zernike order of the image defect.

* * * * *

UNITED STATES PATENT AND TRADEMARK OFFICE
CERTIFICATE OF CORRECTION

PATENT NO.         : 9,069,263 B2                                  Page 1 of 1
APPLICATION NO.    : 12/836176
DATED              : June 30, 2015
INVENTOR(S)        : Conradi et al.

It is certified that error appears in the above-identified patent and that said Letters Patent is hereby corrected as shown below:

Title Page, Col. 2, line 2, Item (57) under "ABSTRACT", delete "micro lithography" and insert -- microlithography --.

In the Specification

Col. 2, line 9, delete "quadrafoil" and insert -- quatrefoil --.

Col. 3, line 64, delete "abberative" and insert -- aberrative --.

Col. 13, line 40, delete "manipulaters" and insert -- manipulators --.

Col. 13, line 41, delete "ore" and insert -- or --.

In the Claims

Col. 15, line 40, Claim 12, after "method", insert -- of --.

Col. 15, line 46, Claim 13, delete "onefold," and insert -- one-fold, --.

Signed and Sealed this
Eighth Day of March, 2016

Michelle K. Lee
*Director of the United States Patent and Trademark Office*